United States Patent
Yamada et al.

(10) Patent No.: US 8,093,801 B2
(45) Date of Patent: Jan. 10, 2012

(54) DISPLAY DEVICE HAVING PARABOLIC LIGHT REFLECTING PORTIONS FOR ENHANCED EXTRACTION OF LIGHT

(75) Inventors: Jiro Yamada, Kanagawa (JP); Mitsuhiro Kashiwabara, Kanagawa (JP); Toshihiro Fukuda, Kanagawa (JP); Reo Asaki, Tokyo (JP); Gentaro Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 439 days.

(21) Appl. No.: 12/190,858

(22) Filed: Aug. 13, 2008

(65) Prior Publication Data
US 2009/0079336 A1 Mar. 26, 2009

(30) Foreign Application Priority Data
Aug. 17, 2007 (JP) .................. 2007-212956

(51) Int. Cl.
*H01L 51/50* (2006.01)
(52) U.S. Cl. ...................................... 313/504
(58) Field of Classification Search .......... 313/110–113, 313/504, 505, 509; 359/853, 868, 876; 362/241, 362/247, 560; 385/146
See application file for complete search history.

(56) References Cited

U.S. PATENT DOCUMENTS

| | | | | | |
|---|---|---|---|---|---|
| 4,240,692 | A | * | 12/1980 | Winston | 385/146 |
| 7,572,037 | B2 | * | 8/2009 | Fukuda et al. | 362/347 |
| 2002/0101152 | A1 | * | 8/2002 | Kimura | 313/505 |
| 2003/0116719 | A1 | * | 6/2003 | Miyazawa | 250/484.2 |
| 2004/0145303 | A1 | * | 7/2004 | Yamada et al. | 313/504 |
| 2005/0225233 | A1 | * | 10/2005 | Boroson et al. | 313/504 |
| 2005/0253788 | A1 | * | 11/2005 | Benoit et al. | 345/76 |
| 2007/0182297 | A1 | * | 8/2007 | Drazic et al. | 313/110 |

FOREIGN PATENT DOCUMENTS

| | | |
|---|---|---|
| JP | WO 01/039554 | 5/2001 |
| JP | 2002-184567 | 6/2002 |
| JP | 2003-077648 | 3/2003 |
| JP | 2003-282260 | 10/2003 |
| JP | 2004-259607 | 9/2004 |
| JP | 3703028 | 7/2005 |
| JP | 2005-531102 | 10/2005 |
| JP | 2005-317225 | 11/2005 |

OTHER PUBLICATIONS

Japanese Patent Office Action corresponding to Japanese Serial No. 2007-212956 dated Sep. 29, 2009.

* cited by examiner

*Primary Examiner* — Nimeshkumar Patel
*Assistant Examiner* — Steven Horikoshi
(74) *Attorney, Agent, or Firm* — SNR Denton US LLP

(57) ABSTRACT

Disclosed herein is a display device provided with: (A) a plurality of light-emitting devices comprising a first electrode, an organic layer including a light-emitting layer and a second electrode configured to resonate light, which is generated in the light-emitting layer, between a first interface defined by an interface between the first electrode and the organic layer and a second interface defined by an interface between the second electrode and the organic layer, and (B) a transparent upper substrate having a first side facing the second electrode and a second side located on an opposite side of the first side, and fixed above the second electrode.

8 Claims, 17 Drawing Sheets

DISPLAY DEVICE HAVING PARABOLIC LIGHT REFLECTING PORTIONS FOR ENHANCED EXTRACTION OF LIGHT

CROSS REFERENCES TO RELATED APPLICATIONS

The present invention contains subject matter related to Japanese Patent Application JP 2007-212956 filed in the Japan Patent Office on Aug. 17, 2007, the entire contents of which being incorporated herein by reference.

BACKGROUND OF THE INVENTION

1. Field of the Invention

This invention relates to a display device, and more specifically, to a display device equipped with light-emitting devices having a resonator structure.

2. Description of the Related Art

In recent years, lighting devices and organic electroluminescence display devices (hereinafter simply called "organic EL display devices") making use of organic electroluminescence devices (hereinafter simply called "organic EL devices") are finding widespread utility. Concerning organic EL display devices, there is a strong demand for the development of a technology that makes it possible to realize an efficient output of light, because a low light output efficiency means ineffective utilization of an actual luminous quantity in an organic EL device and becomes a cause of a significant loss in power consumption or the like.

Under these circumstances, several technologies have been proposed for organic EL display devices. A technology that is intended to achieve an improvement in light output efficiency by the arrangement of a protuberance structure is disclosed, for example, in JP-A-2003-077648 (hereinafter referred to as Patent Document 1). A technology that is intended to achieve an improvement in light output efficiency by the arrangement of microlenses is disclosed, for example, in JP-A-2002-184567 (hereinafter referred to as Patent Document 2) or JP-T-2005-531102 (hereinafter referred to as Patent Document 3). Further, organic EL display devices having various reflectors, including the structure of a compound parabolic concentrator (CPC) useful as a concentrator for a solar battery, are also disclosed in Patent Document 3.

It has also been attempted to control light, which is to be generated in a light-emitting layer, by introducing a resonator structure, for example, to improve the color purity of the light or to increase the efficiency of light emission (see, for example, WO 01/39554 A1, hereinafter referred to as Patent Document 4). It is also disclosed, for example, in Japanese Patent No. 3703028 (hereinafter referred to as Patent Document 5) that the intensity of light emission can be maximized by controlling light, which is generated in a resonator structure, and light beams, which are reflected back from its reflection end portions, into a mutually-intensifying relation.

SUMMARY OF THE INVENTION

According to Patent Documents 1, 2 and 3, a reduction in power consumption can be achieved by making effective use of light which would otherwise be wasted through total reflection in a light-emitting device. These patent documents, however, make no mention about optical conditions for an organic EL device, specifically, the optimization of an organic layer, which includes a light-emitting layer, in an organic EL device for the improvement of light outputting efficiency. According to Patent Documents 4 and 5, on the other hand, the efficiency of light output can be increased by introducing a resonator structure. There is, however, an outstanding strong demand for a further improvement in the efficiency of light output.

It is desirable to provide a display device equipped with a resonator structure and having a structure or construction that makes it possible to achieve a still further improvement in the efficiency of light output.

The present invention provides, in a first or second embodiment thereof, a display device provided with:

(A) a plurality of light-emitting devices comprising a first electrode, an organic layer including a light-emitting layer and a second electrode to resonate light, which is generated in the light-emitting layer, between a first interface defined by an interface between the first electrode and the organic layer and a second interface defined by an interface between the second electrode and the organic layer, and (B) a transparent upper substrate having a first side facing the second electrode and a second side located on an opposite side of the first side, and fixed above the second electrode.

The display device satisfies the below-described equations (1-1), (1-2), (1-3) and (1-4).

In the display device according to the first embodiment of the present invention, light reflecting portions are formed, at least one per each light-emitting device, and the light reflecting portions extend from the first side to an interior of the transparent upper substrate such that the portion of the resonant light entered the transparent upper substrate is reflected and is outputted from the second side of the transparent upper substrate.

In the display device according to the second embodiment of the present invention, on the other hand, lens portions are formed, at least one per each light-emitting device, and the lens portions are all formed on the first side of the transparent upper substrate such that the portion of the resonant light outputted from the light-emitting layer via the second electrode is allowed to pass through the lens portions.

$$0.7\{-\Phi_1/(2\Pi)+m_1\} \leq 2 \times OL_1/\lambda \leq 1.2\{-\Phi_1/(2\Pi)+m_1\} \quad (1\text{-}1)$$

$$0.7\{-\Phi_2/(2\Pi)+m_2\} \leq 2 \times OL_2/\lambda \leq 1.2\{-\Phi_2/(2\Pi)+m_2\} \quad (1\text{-}2)$$

$$L_1 < L_2 \quad (1\text{-}3)$$

$$m_1 < m_2 \quad (1\text{-}4)$$

where, $L_1$: Distance from a maximum light-emitting position of the light-emitting layer to the first interface, $OL_1$: Optical distance from the maximum light-emitting position of the light-emitting layer to the first interface, $L_2$: Distance from the maximum light-emitting position of the light-emitting layer to the second interface, $OL_2$: Optical distance from the maximum light-emitting position of the light-emitting layer to the second interface, $m_1$, $m_2$: integers, $\lambda$: Wavelength of a maximum peak in a spectrum of light generated in the light-emitting layer, $\Phi_1$: Phase shift of reflected light occurred at the first interface (unit: radian), with a proviso of $-2\Pi < \Phi_1 \leq 0$, and $\Phi_2$: Phase shift of reflected light occurred at the second interface (unit: radian), with a proviso of $-2\Pi < \Phi_2 \leq 0$.

It is to be noted that the term "the distance $L_1$ from a maximum light-emitting position of the light-emitting layer to the first interface" indicates the actual distance (physical distance) from the maximum light-emitting position of the light-emitting layer to the first interface while the term "the distance $L_2$ from the maximum light-emitting position of the light-emitting layer to the second interface" indicates the actual distance (physical distance) from the maximum light-emitting position of the light-emitting layer to the second interface. On the other hand, the term "optical distance" is also called "optical path length", and generally indicates n×L when light travels over a distance L through a medium having a refractive index n. The same definitions shall apply hereinafter. Accordingly, when the average refractive index of the organic layer is assumed to be $n_{ave}$, the following relations exist:

$$OL_1 = L_1 \times n_{ave}$$

$$OL_2 = L_2 \times n_{ave}$$

Here, the term "average refractive index $n_{ave}$" means the quotient obtained by summing up the products of the refractive indices of respective layers making up an organic layer and their thickness values and then dividing the total of the products by the thickness of the organic layer.

The display device according to the first embodiment of the present invention can be constructed in such an embodiment that the plurality of light-emitting devices are arrayed in stripes and more than one of light reflecting portions are arranged per each light-emitting device. As an alternative, the plurality of light-emitting devices can be arranged in a diagonal array, delta array or rectangle array, and one light reflecting portion can be arranged per light-emitting device. It is to be noted that the above-described technical features can also be applied to a display device according to a third embodiment of the present invention to be described subsequently herein.

In the display device according to the first embodiment of the present invention which may include the above-described preferred embodiment, it is desired that:

each light reflecting portion is formed of a part of a surface of a solid revolution, the light reflecting portion is located at a lower end portion thereof in the first side of the transparent upper substrate, the light reflecting portion is located at an upper end portion thereof in the interior of the transparent upper substrate, and the upper end portion of the light reflecting portion is in parallel with the second side of the transparent upper substrate, and when an axis of the light reflecting portion as an axis of revolution of the solid revolution is assumed to be a z-axis, the display device satisfies the following equation:

$$(r_{Ref-T} + r_{Ref-B})/L_{Ref} \leq (n_{Sub-T}^2 - 1)^{-1/2}$$

where, $r_{Ref-B}$: Radius of the lower end portion of the light reflecting portion, $r_{Ref-T}$: Radius of the upper end portion of the light reflecting portion, $L_{Ref}$: Distance from the lower end portion to the upper end portion of the light reflecting portion along the z-axis, and $n_{Sub-T}$: Refractive index of the transparent upper substrate.

In this desired embodiment, it is desired that:

the light reflecting portion has a cross-sectional shape formed of a part of a parabola when the light reflecting portion is cut along an imaginary plane including the z-axis, a perpendicular line drawn from a focal point of the parabola to the a directrix is aslant to the z-axis, and the display device satisfies the following equation:

$$0.1 \leq r_{Ref-B}/L_{Focus} < 0.5$$

where, $L_{Focus}$: Distance from an intersection between the imaginary plane and the lower end portion of the reflecting portion to the focal point of the parabola when the light reflecting portion is cut along the imaginary plane.

When constructed as described immediately above, it is possible to achieve an improvement in brightness within an effective visual range, and therefore, to obtain a bright screen while assuring a still further reduction in the power consumption of the display device.

It is also desired that an angle of inclination $\theta_{Para}$ of the perpendicular line, which is drawn from the focal point of the parabola to the directrix, to the z-axis satisfies the following equation:

$$\sin(\theta_{Para}) < 1/n_{Sub-T}$$

where, $n_{Sub-T}$: Refractive index of the transparent upper substrate.

Desirably, the focal point of the parabola may be included in the first side of the transparent upper substrate. It is to be noted that symmetrical two shapes are obtained as cross-sections of the light reflecting portion when the light reflecting portion is cut along the imaginary plane including the z-axis. Whenever a discussion is to be made about the cross-sectional shape of the light reflecting portion as obtained when the light reflecting portion is cut along the imaginary plane including the z-axis, the discussion will be made on one of such two shapes. It is to be noted that the above technical features can also be applied to the display device according to the third embodiment of the present invention to be descried subsequently herein by reading "transparent upper substrate" as "transparent lower substrate", "second electrode" as "first electrode", and "$n_{Sub-T}$" as "$n_{Sub-B}$", respectively.

As an alternative, the display device according to the first embodiment of the present invention may be constructed such that:

each light reflecting portion is formed of a part of a surface of a solid revolution, the light reflecting portion is located at a lower end portion thereof in the first side of the transparent upper substrate, the light reflecting portion is located at an upper end portion thereof in the interior of the transparent upper substrate, and the upper end portion of the light reflecting portion is in parallel with the second side of the transparent upper substrate, and when an axis of the light reflecting portion as an axis of revolution of the solid revolution is assumed to be a z-axis, the display device satisfies the following equation:

$$\sin(\theta_{0-2}) > 1/n_{Sub-T}$$

where, $\theta_{0-2}$: Angle formed by the light, which is outputted from the second electrode, with the z-axis at an intersection between the z-axis and the second electrode on a side of the second electrode, and $n_{Sub-T}$: Refractive index of the transparent upper substrate.

It is to be noted that the above technical features can also be applied to the display device according to the third embodiment of the present invention to be descried subsequently herein by reading "transparent upper substrate" as "transparent lower substrate", "second electrode" as "first electrode", "$n_{Sub-T}$" as "$n_{Sub-B}$", and "$\theta_{0-2}$" as "$\theta_{0-1}$", respectively.

The display device according to the second embodiment of the present invention can be constructed in such an embodiment that the plurality of light-emitting devices are arrayed in stripes and more than one of lens portions are arranged per each light-emitting device. As an alternative, the plurality of light-emitting devices can be arranged in a diagonal array, delta array or rectangle array, and one lens portion can be arranged per light-emitting device. It is to be noted that the above-described technical features can also be applied to a display device according to a fourth embodiment of the present invention to be described subsequently herein.

In the display device according to the second embodiment of the present invention which may include the above-described preferred embodiment, it is desired that:

when an axis of each lens portion as an optic axis is assumed to be a z-axis, the display device satisfies the following equation:

$$\sin(\theta_{0-2}) > 1/n_{Sub-T}$$

where, $\theta_{0-2}$: Angle formed by the light, which is outputted from the second electrode, with the z-axis at an intersection between the z-axis and the second electrode on a side of the second electrode, and $n_{Sub-T}$: Refractive index of the transparent upper substrate.

It is to be noted that the above technical features can also be applied to the display device according to the fourth embodiment of the present invention to be descried subsequently herein by reading "second electrode" as "first electrode", "$\theta_{0-2}$" as "$\theta_{0-1}$", and "$n_{Sub-T}$" as "$n_{Sub-B}$", respectively.

In the display device according to the first embodiment or second embodiment of the present invention which may include one or more of the above-described preferred embodiments and/or features, it is desired that:

the first electrode may have an average light reflectance of at least 50%, with 80% or higher being preferred, and the second electrode has an average light reflectance of from 50 to 90%, with from 60% to 90% being more preferred.

It is to be noted that the above technical features can also be applied to the display device according to the third embodiment or fourth embodiment of the present invention to be descried subsequently herein by reading "second electrode" as "first electrode".

The display device according to the first embodiment or second embodiment of the present invention can be constructed in an embodiment that the first electrode is formed of a light reflecting material, the second electrode is formed of a semi-transparent material, and $m_1=0$ and $m_2=1$ which can make highest the efficiency of light output. In the display device according to the first embodiment or second embodiment of the present invention or the display device according to the fifth embodiment of the present invention to be described subsequently herein, electrons can be supplied in a quantity necessary and sufficient for higher efficiency to the light-emitting layer efficiently at a low drive voltage by making an electron transport layer (electron supply layer) thicker than a hole transport layer (hole support layer). Described specifically, the supply of holes can be increased by arranging the hole transport layer between the first electrode, which corresponds to an anode electrode, and the light-emitting layer and forming the hole transport layer with a thickness smaller than the electron transport layer. This construction makes it possible to obtain a carrier balance with neither too much nor too little holes or electrons and with a sufficiently large carrier supply, and therefore, to obtain a high efficiency of light emission. Because holes and electrons are neither too much nor too little, the carrier balance is resistant to disruption, a drive deterioration is reduced, and the light-emitting life can be prolonged.

The display device according to the first embodiment or second embodiment of the present invention, which may include one or more of the above-described preferred embodiments and/or features, may be constructed in an embodiment that a protective film and an adhesive layer are formed in this order from the side of the second electrode between the second electrode and the transparent upper substrate. As a material for forming the protective film, it is preferred to use a material which is transparent to light generated in the light-emitting layer, is dense, and does not allow water to permeate therethrough. Specific examples include amorphous silicon ($\alpha$-Si), amorphous silicon carbide ($\alpha$-SiC), amorphous silicon nitride ($\alpha$-Si$_{1-x}$N$_x$), amorphous silicon oxide ($\alpha$-Si$_{1-y}$N$_y$), amorphous carbon ($\alpha$-C), amorphous silicon oxynitride ($\alpha$-SiON), and Al$_2$O$_3$. As materials capable of forming the adhesive layer, thermosetting adhesives, such as acrylic adhesives, epoxy adhesives, urethane adhesives, silicone adhesives and cyanoacrylate adhesives, and UV-curable adhesives can be mentioned. Further, the display devices according to the third embodiment to fifth embodiment of the present invention to be described subsequently herein can also be constructed in an embodiment that a second substrate is arranged above the second electrode and the above-mentioned protective film and adhesive layer are formed in this order from the side of the first electrode between the first electrode and the second substrate.

The present invention provides, in third or fourth embodiment thereof, a display device provided with:

(A) a transparent lower substrate having a first side and a second side located opposite the first side, and (B) a plurality of light-emitting devices, arranged on or above the first side of the transparent lower substrate, comprising a first electrode, an organic layer including a light-emitting layer and a second electrode to resonate light, which is generated in the light-emitting layer, between a first interface defined by an interface between the first electrode and the organic layer and a second interface defined by an interface between the second electrode and the organic layer, The display device satisfies the below-described equations (2-1), (2-2), (2-3) and (2-4).

In the display device according to the third embodiment of the present invention, light reflecting portions are formed, at least one per each light-emitting device, and the light reflecting portions extend from the first side to an interior of the transparent lower substrate such that the portion of the resonant light entered the transparent upper substrate is reflected and is outputted from the second side of the transparent upper substrate.

In the display device according to the fourth embodiment of the present invention, on the other hand, lens portions are formed, at least one per each light-emitting device, and the lens portions are all formed on the first side of the transparent lower substrate such that the portion of the resonant light outputted from the light-emitting layer via the second electrode is allowed to pass through the lens portions.

$$0.7\{-\Phi_1/(2\Pi)+m_1\} \leq 2 \times OL_1/\lambda \leq 1.2\{-\Phi_1/(2\Pi)+m_1\} \quad (2\text{-}1)$$

$$0.7\{-\Phi_2/(2\Pi)+m_1\} \leq 2 \times OL_1/\lambda \leq 1.2\{-\Phi_1/(2\Pi)+m_1\} \quad (2\text{-}2)$$

$$L_1 > L_2 \quad (2\text{-}3)$$

$$m_1 > m_2 \quad (2\text{-}4)$$

where, $L_1$: Distance from a maximum light-emitting position of the light-emitting layer to the first interface, $OL_1$: Optical distance from the maximum light-emitting position of the light-emitting layer to the first interface, $L_2$: Distance from the maximum light-emitting position of the light-emitting layer to the second interface, $OL_2$: Optical distance from the maximum light-emitting position of the light-emitting layer to the second interface, $m_1$, $m_2$: integers, $\lambda$: Wavelength of a maximum peak in a spectrum of light generated in the light-emitting layer, $\Phi_1$: Phase shift of reflected light occurred at the first interface (unit: radian), with a proviso of $-2\Pi < \Phi_1 \leqq 0$, and $\Phi_2$: Phase shift of reflected light occurred at the second interface (unit: radian), with a proviso of $-2\Pi < \Phi_2 \leqq 0$.

The display device according to the third embodiment or fourth embodiment of the present invention can be constructed in an embodiment that the first electrode is formed of a semi-transparent material, the second electrode is formed of a light reflecting material, and $m_1 = 1$ and $m_2 = 2$ which can make highest the efficiency of light output. In the display device according to the third embodiment or fourth embodiment of the present invention, necessary and sufficient electrons can also be supplied in a quantity necessary and sufficient for higher efficiency to the light-emitting layer at a low drive voltage by making an electron transport layer thicker than a hole transport layer. Described specifically, the supply of holes can be increased by arranging the hole transport layer between the second electrode, which corresponds to an anode electrode, and the light-emitting layer and forming the hole transport layer with a thickness smaller than the electron transport layer. This construction makes it possible to obtain a carrier balance with neither too much nor too little holes or electrons and with a sufficiently large carrier supply, and therefore, to obtain a high efficiency of light emission. Because holes and electrons are neither too much nor too little, the carrier balance is resistant to disruption, a drive deterioration is reduced, and the light-emitting life can be prolonged.

The present invention provides, in fifth embodiment thereof, a display device provided with:

a plurality of light-emitting devices comprising a first electrode, an organic layer including a light-emitting layer and a second electrode to resonate light, which is generated in the light-emitting layer, between a first interface defined by an interface between the first electrode and the organic layer and a second interface defined by an interface between the second electrode and the organic layer, wherein:

the display device satisfies the below-described equations (3-1), (3-2), (3-3) and (3-4):

$$0.7\{-\Phi_1/(2\Pi)+m_1\} \leqq 2 \times OL_1/\lambda \leqq 1.2\{-\Phi_1/(2\Pi)+m_1\} \quad (3\text{-}1)$$

$$0.7\{-\Phi_2/(2\Pi)+m_2\} \leqq 2 \times OL_2/\lambda \leqq 1.2\{-\Phi_2/(2\Pi)+m_2\} \quad (3\text{-}2)$$

$$L_1 < L_2 \quad (3\text{-}3)$$

$$m_1 < m_2 \quad (3\text{-}4)$$

where, $L_1$: Distance from a maximum light-emitting position of the light-emitting layer to the first interface, $OL_1$: Optical distance from the maximum light-emitting position of the light-emitting layer to the first interface, $L_2$: Distance from the maximum light-emitting position of the light-emitting layer to the second interface, $OL_2$: Optical distance from the maximum light-emitting position of the light-emitting layer to the second interface, $m_1$, $m_2$: integers, $\lambda$: Wavelength of a maximum peak in a spectrum of light generated in the light-emitting layer, $\Phi_1$: Phase shift of reflected light occurred at the first interface (unit: radian), with a proviso of $-2\Pi < \Phi_1 \leqq 0$, and $\Phi_2$: Phase shift of reflected light occurred at the second interface (unit: radian), with a proviso of $-2\Pi < \Phi_2 \leqq 0$.

In the display device according to the fifth embodiment of the present invention, it is desired that:

the first electrode may have an average light reflectance of at least 50%, with 80% or higher being preferred, and the second electrode has an average light reflectance of from 50 to 90%, with from 60% to 90% being more preferred.

The display device according to the fifth embodiment of the present invention, which may include one or more of the above-described preferred embodiments, can be constructed in an embodiment that the first electrode is formed of a light reflecting material, the second electrode is formed of a semi-transparent material, and $m_1 = 0$ and $m_2 = 1$ which can make highest the efficiency of light output.

DETAILED DESCRIPTION OF THE PREFERRED EMBODIMENTS

Figure 1:
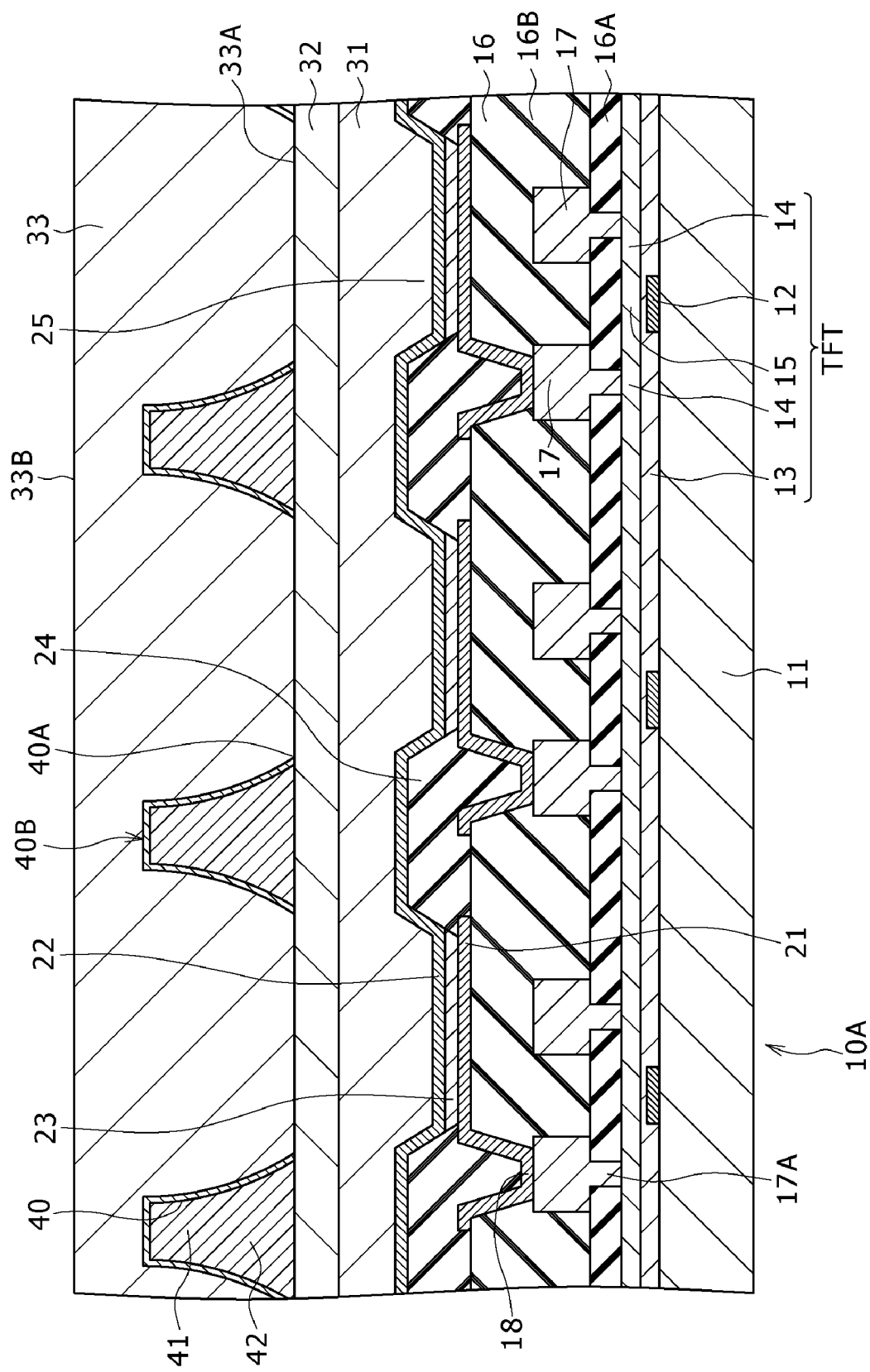
FIG. 1 is a schematic fragmentary cross-sectional view of a display device of Example 1.

As a material (light reflecting material) for forming the first electrode in the display device according to the first embodiment, second embodiment or fifth embodiment of the present invention (these display devices may collectively be called "the surface-emitting display device") or the second electrode in the display device according to the third embodiment or fourth embodiment of the present invention (these display devices may collectively be called "the bottom-emitting display device") (these electrodes may be called "the light reflecting electrodes" for the sake of convenience) a metal having a high work function, such as, for example, platinum (Pt), gold (Au), silver (Ag), chromium (Cr), tungsten (W), nickel (Ni), copper (Cu), iron (Fe), cobalt (Co) or tantalum (Ta), or an alloy having a high work function (for example, an Ag—Pd—Cu alloy composed of silver as a principal component and containing 0.3 wt % to 1 wt % of palladium (Pd) and 0.3 wt % to 1 wt % of copper (Cu), or an Al—Nd alloy) can be mentioned when the light reflecting electrode is caused to act as an anode electrode. When an electrical conductive material having a small work function and a high light reflectance, such as aluminum (Al) or an aluminum-containing alloy, is used, the electrode can be used as an anode electrode by arranging an appropriate hole injection layer or the like to improve its hole injection property. As the thickness of the light reflecting electrode, 0.1 µm to 1 µm can be mentioned by way of example. It is also possible to adopt a structure that a transparent conductive material excellent in hole injection property, such as an oxide of indium and tin (ITO) or an oxide of indium and zinc (IZO), is stacked over a dielectric multi-layer film or a reflective film having high light reflecting property such as aluminum (Al). When it is desired to make the light reflecting electrode function as a cathode electrode, on the other hand, it is desired to form the light-reflecting electrode with an electrical conductive material having a small work function and a high light reflectance. By using an appropriate electron injection layer or the like in combination with an electrical conductive material having a high light reflectance and used as an anode electrode to improve its electron injection property, the anode electrode can be used as a cathode electrode.

As a material (semi-transparent material) for forming the second electrode in the display device (the surface-emitting display device) according to the first embodiment, second embodiment or fifth embodiment of the present invention or the first electrode in the display device (the bottom-emitting display device) according to the third embodiment or fourth embodiment of the present invention (these electrodes may be called "the semi-transparent electrodes" for the sake of convenience), it is desired to form the semi-transparent electrode with an electrical conductive material, which can transmit generated light therethrough and has a small work function, to permit an efficient injection of electrons into the organic layer when it is desired to make the semi-transparent electrode function as a cathode electrode. For example, a metal or alloy having a small work function such as aluminum (Al), magnesium (Mg), calcium (Ca), sodium (Na), an alloy of magnesium and silver (Mg—Ag alloy) or an alloy of aluminum (Al) and lithium (Li) (Al—Li alloy) can be mentioned. Among these, an Mg—Ag alloy is preferred, and as a volume ratio of magnesium to silver, Mg:Ag=5:1 to 30:1 can be exemplified. As the thickness of the semi-transparent electrode, 4 nm to 50 nm, preferably 4 nm to 20 nm, more preferably 6 nm to 12 nm can be exemplified. The semi-transparent electrode can also be formed into a stacked structure of a layer of the above-mentioned material and a so-called transparent electrode formed, for example, of ITO or IZO (thickness: $3 \times 10^{-8}$ m to $1 \times 10^{-6}$ m, for example) arranged in this order from the side of the organic layer. Further, a bus electrode (auxiliary electrode) formed of a low-resistance material may also be arranged in combination with the semi-transparent electrode to achieve a reduction in resistance as the whole semi-transparent electrode. When it is desired to make the semi-transparent electrode function as an anode electrode, on the other hand, the semi-transparent electrode may desirably be formed with an electrical conductive material which can transmit generated light and has a large work function.

As processes for forming the first electrode and second electrode, it is possible to mention, for example, combinations of an evaporation process including electron beam evaporation, hot filament evaporation or vacuum evaporation, a sputtering process, a chemical vapor deposition process (CVD process) or an ion plating process with an etching process; various printing processes such as screen printing, inkjet printing and metal mask printing; plating processes (electroplating processes and electroless plating processes); liftoff deposition processes; laser abrasion processes; sol-gel processes; and so on. According to these various printing processes and plating processes, the first electrode and second electrode can be directly formed in desired configurations (patterns). Upon formation of the first electrode and second electrode after the formation of the organic layer, it is preferred, from the viewpoint of protecting the organic layer from damage, to form them specifically by a film-forming process, which requires small energy for film-forming particles such as a vacuum deposition process, or a film-forming process like the MOCVD process. Occurrence of damage on the organic layer has a potential problem that non-luminous pixels (or non-emitting subpixels) called "unlit defects" may occur due to the occurrence of leak currents. From the viewpoint of preventing a deterioration of the organic layer by water in air, it is preferred to perform the fabrication steps from the formation of the organic layer to the formation of these electrodes without exposure to the atmosphere.

The first electrode and second electrode each absorbs a portion of entered light, and reflects the remaining portion. A phase shift, therefore, occurs in the reflected light. These phase shifts $\Phi_1$, $\Phi_2$ can be determined by measuring the values of the real part and imaginary part of the complex refractive index of a material, which forms the first electrode and second electrode, respectively, for example, by using an ellipsometer and then conducting a calculation on the basis of these values (see, for example, "Principles of Optics", Max Born and Emil Wolf, 1974 (PERGAMON PRESS)). It is to be noted that refractive indices of the organic layer and the like can also be determined using an ellipsometer.

The light reflecting portions in the display device according to the first embodiment or third embodiment of the present invention is made, for example, of a light reflecting layer formed on the transparent upper substrate or transparent lower substrate. As the light reflecting layer, an aluminum (Al) layer, an aluminum alloy layer (for example, Al—Nd layer), a chromium (Cr) layer, a silver (Ag) layer, or a silver alloy layer (for example, Ag—Pd—Cu layer or Ag—Sm—Cu layer) can be mentioned. These light reflecting portions can be formed, for example, by an evaporation process including electron beam evaporation, hot filament evaporation or vacuum evaporation, a sputtering process, a CVD process or an ion plating process; a plating process (an electroplating process or electroless plating process); a liftoff deposition process; a laser abrasion process; a sol-gel process; or the like. The transparent upper substrate or transparent lower substrate provided with these light reflecting portions can be fabricated, for example, by such a process that cavities are formed on the first side by using a stamper or cavities are formed on the first side by cutting work and, after light reflecting layers are formed on exposed surfaces of such cavities, the cavities filled up, although its fabrication process varies depending upon the material that makes it up.

For example, when the planar shape of the light-emitting region of each light-emitting device is assumed to be rectangular, the length of one side of such a light-emitting region is assumed to be $L_p$, and the length of another side perpendicularly intersecting the one side is assumed to be $\alpha \times L_p$ (coefficient $\alpha>1$) in the display device according to the first embodiment or third embodiment of the present invention, the integer part of the coefficient $\alpha$ or (the integer part of the coefficient $\alpha-1$) can be exemplified as the specific number of plural light reflecting portions to be arranged per light-emitting device.

In the display device according to the first embodiment or third embodiment of the present invention, each light reflecting portions may preferably be formed from a part of a surface of a solid revolution. When the axis of the light reflecting portion as the axis of revolution of the solid revolution is assumed to be a z-axis, the cross-sectional shape of the light reflecting portion when the light reflecting portion is cut along an imaginary plane including the z-axis may preferably be formed of a part of a parabola. However, the cross-sectional shape may also be formed of a part of another curve. The solid revolution can be, for example, a sphere, an ellipsoid of revolution, or a paraboloid of revolution. The surface of the light reflecting portion can also be a curved surface obtained by revolving a part of a curve represented by a tri- or higher polynomial, specifically, exemplified by a bifolium curve, trefoil curve, quadrifolium curve, lemniscate, limacon, folium, conchoid, cissoid, probability, tractrix, catenary, cycloid, trochoid, asteroid, semicubical parabola, lissajous, witch of Agnesi, epicycloid, cardioids, hypocycloid, clothed curve, or helix.

As a material for forming lens portions in the display device according to the second embodiment or fourth embodiment of the present invention, plastics such as a polymethyl methacrylate resin (PMMA), polycarbonate resin (PC), polyacrylate resin (PAR), polyethylene terephthalate (PET), acrylic resin or ABS resin; or glass can be mentioned, for example. When the lens portions are formed as convex lenses, the convex lenses which construct the lens portions may preferably be formed as aspherical lenses although they can be spherical lenses. Further, the convex lenses may also be formed of planoconvex lenses, double-convex lenses, or meniscus convex lenses. These lens portions can be formed in a manner known per se in the art.

For example, when the planar shape of the light-emitting region of each light-emitting device is assumed to be rectangular, the length of one side of such a light-emitting region is assumed to be $L_p$, and the length of another side perpendicularly intersecting the one side is assumed to be $\alpha \times L_p$ (coefficient $\alpha>1$) in the display device according to the fourth embodiment of the present invention, the integer part of the coefficient $\alpha$ or (the integer part of the coefficient $\alpha-1$) can be exemplified as the specific number of plural light reflecting portions to be arranged per light-emitting device.

In the display devices according to the first embodiment to fifth embodiment of the present invention (these display devices will hereinafter be collectively and simply called "the display device according to the present invention"), the plural light-emitting devices are formed on the first substrate. Examples of the first substrate or second substrate include high strain-point glass substrates, soda glass ($Na_2O.CaO.SiO_2$) substrates, borosilicate glass ($Na_2O.B_2O_3.SiO_2$) substrates, forsterite ($2MgO.SiO_2$) substrates, lead glass ($Na_2O.PbO.SiO_2$) substrates, silicon substrates with insulating layers formed on their surfaces, and organic polymers exemplified by polymethyl methacrylate (PMMA), polyvinyl alcohol (PVA), polyvinylphenol (PVP), polyethersulfone (PES), polyimides, polycarbonates, and polyethylene terephthalate (PET) (which have forms of plastic materials such as plastic films, plastic sheets or plastic substrates formed of the plastic materials and provided with flexibility). In each bottom-emitting display device, however, the first substrate is required to be transparent to light to be outputted by the light-emitting devices. In each bottom-emitting display device, the first substrate may also serve as the transparent lower substrate. When the first substrate does not serve as the transparent lower substrate too, the above-mentioned materials can be mentioned as materials for forming the transparent lower substrate. In the display devices according to the first embodiment and second embodiment of the present invention, the above-mentioned materials can be mentioned as materials for forming the transparent lower substrates. The material of the first substrate and second substrate, the material of the transparent upper substrate and the material for the transparent lower substrate may be the same or different.

As a display device according to the present invention, an organic electroluminescence display device (abbreviated as "the organic EL display device") can be mentioned. When this organic EL display device is designed as an organic EL color display device, subpixels are formed by each of the organic EL devices which make up the organic EL color display device. A single pixel is formed, for example, of three kinds of subpixels, that is, a red-light emitting subpixel for emitting red light, a green-light emitting subpixel for emitting green light, and a blue-light emitting subpixel for emitting blue light. When the number of the organic EL devices which make up the organic EL display device is assumed to be N×M devices in the above-described case, its pixel number is (N×M)/3. As other display devices according to the present invention, lighting devices including backlight units for liquid crystal display devices and surface light source units can be mentioned.

The organic layer includes the light-emitting layer. Described specifically, the organic layer can be constructed, for example, of a stacked structure of a hole transport layer, a light-emitting layer and an electron transport layer, a stacked structure of a hole transport layer and a light-emitting layer also serving as an electron transport layer, or a stacked structure of a hole injection layer, a hole transport layer, a light-emitting layer, an electron transport layer and an electron injection layer. As processes for forming the organic layer, physical vapor deposition processes (PVD processes) such as vacuum evaporation, printing processes such as screen printing and inkjet printing, laser transfer processes that irradiate a laser onto a stacked structure of a laser absorbing layer and organic layer formed on a transfer substrate to separate the organic layer on the laser absorbing layer for its transfer, and various coating processes can be exemplified. When it is desired to form the organic layer by vacuum evaporation, the organic layer can be obtained, for example, by using a so-called metal mask and then allowing a material to deposit through openings arranged in the metal mask.

The light reflecting electrodes are arranged, for example, on an interlayer insulating layer. This interlayer insulating layer covers light-emitting device drivers. These drivers are formed on the first substrate. Each light-emitting device driver is constructed of one or more thin-film transistors (TFTs), which are electrically connected to the associated first electrode via a corresponding contact plug arranged in the interlayer insulating layer. As a material for forming the interlayer insulating layer, $SiO_2$-based materials such as $SiO_2$, BPSG, PSG, BSG, AsSG, PbSG, SiON, SOG (spin-on glass), low melting-point glass and glass paste; SiN-based materials; and insulating resins such as polyimides can be used either singly or in combination. For the formation of the interlayer insulating layer, a known process such as CVD, coating, sputtering or printing can be used. In a bottom-emitting display device, an interlayer insulating layer has to be formed of a material transparent to light from each light-emitting device, and each light-emitting device driver has to be formed such that it does not block light from the light-emitting device.

For the purpose of preventing water from reaching the organic layer, it is preferred to arrange an insulating or conductive protective film above the organic layer as mentioned above. The protective film may preferably be formed by a film-forming process which requires film-forming particles of small energy, such as vacuum evaporation, or by a film-forming process such as MOCVD, because such a film-forming process gives smaller effects on the underlying layers. Desirably, the film-forming temperature may be set at room temperature to avoid a reduction in brightness due to deteriorations of the organic layer, and the protective film may be formed under such conditions that minimize a stress on the protective film to prevent separation of the protective film. The formation of the protective film may preferably be performed without exposing the already-formed electrode to the atmosphere, and as a consequence, it is possible to avoid deteriorations of the organic layer by water and oxygen in the atmosphere. When the display device is of the surface-emitting type, the protective film may desirably be formed with a material which can transmit, for example, 80% or more of light generated in the organic layer. Specifically, inorganic amorphous insulating materials, for example, the above-mentioned materials can be exemplified. Such an inorganic amorphous insulating material does not form grains, is low in water permeability, and therefore, forms a good protective film. When it is desired to form the protective film with an electrical conductive material, the protective film may be formed with a transparent conductive material such as ITO or IZO.

The transparent upper substrate or the first substrate (transparent lower substrate), through which light from the light-emitting devices pass, may be provided with a color filter or a light shielding film (black matrix) as needed.

In the display devices according to the first embodiment to fourth embodiment of the present invention, the problem of a reduction in the efficiency of light output due to total reflection in light-emitting devices has been solved by the arrangement of light reflecting portions or lens portions. Moreover, in the display devices according to the first embodiment to fifth embodiment of the present invention, the efficiency of light output can be significantly improved by making interference conditions or resonance conditions for light, which are created by the organic layer, first electrode and second electrode of the light-emitting devices, satisfy the predetermined conditions, $L_1 < L_2$ and $m_1 < m_2$, specifically, by positioning the maximum light-emitting position of the light-emitting layer closer to the light reflecting electrode than to the semi-transparent electrode.

With reference to the accompanying drawings, the present invention will hereinafter be described based on Examples.

EXAMPLE 1

Figure 2:
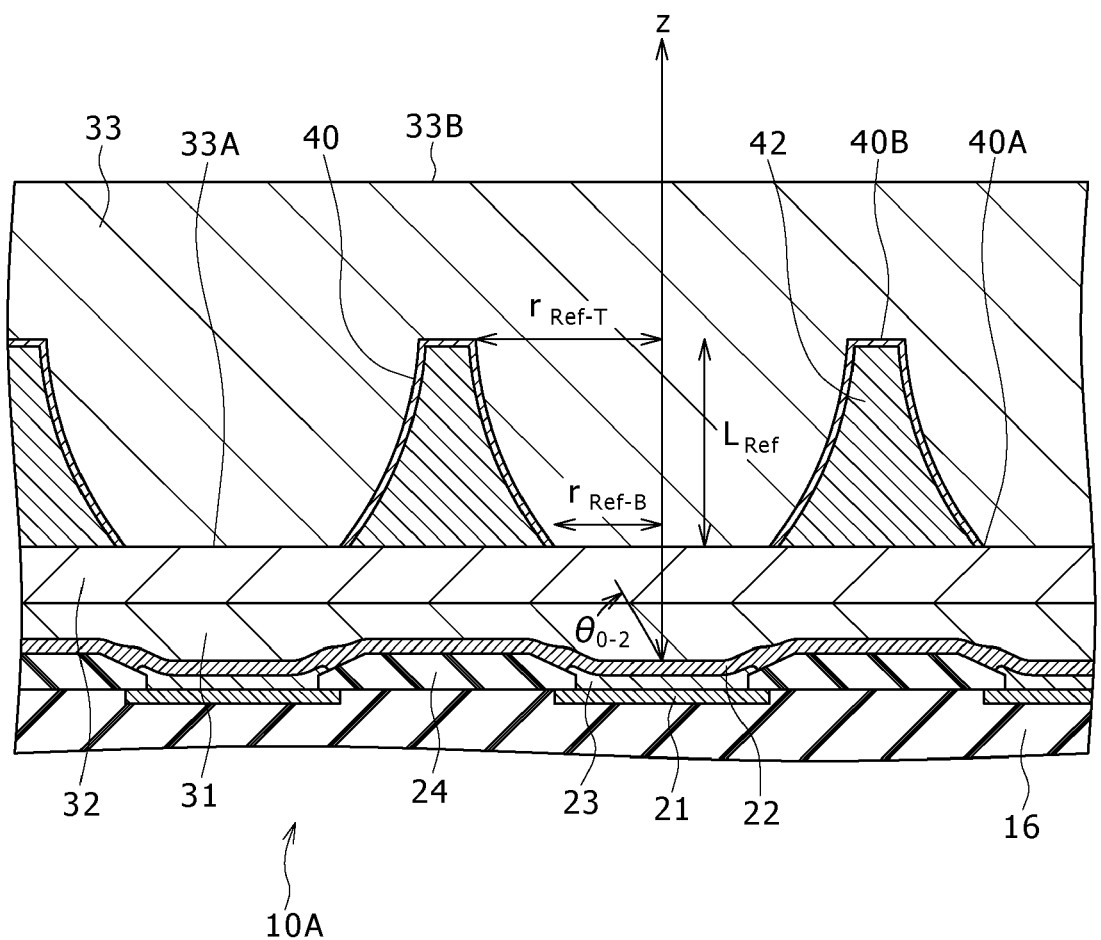
FIG. 2 is a schematic diagram of light reflecting portions in the display device of Example 1.
Figure 3A:
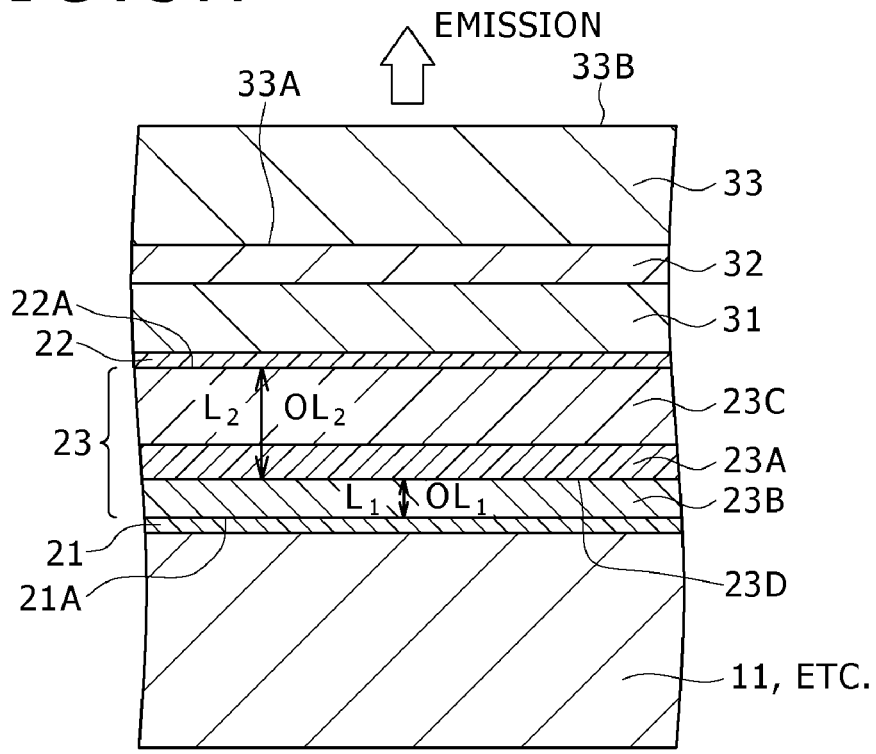
FIG. 3A is a schematic fragmentary diagram of an organic layer and other layers in the display device of Example 1.

Example 1 relates to a display device with which the first embodiment and fifth embodiment of the present invention are concerned, and specifically to an organic EL display device. The display device (which may hereinafter be called "the organic EL display device) of Example 1 is shown, as a schematic fragmentary cross-sectional view, in FIG. 1, a schematic view of its light reflecting portions is depicted in FIG. 2, and a schematic view of its organic layers and the like is illustrated in FIG. 3A. The organic EL display device of Example 1 is an organic EL color display device of the active matrix type, and is of the surface-emitting type. Namely, light is outputted through a second electrode which corresponds to an upper electrode.

The organic EL display device of Example 1 and the below-described organic EL display devices of Examples 2 to 4 are each provided with a plurality (for example, N×M=2, 880×540) of light-emitting devices (specifically, organic EL devices) 10A. It is to be noted that one light-emitting device 10A constitutes one subpixel. Therefore, the organic EL display device has (N×M)/3 pixels. A single pixel is formed of three kinds of subpixels, that is, a red-light emitting subpixel for emitting red light, a green-light emitting subpixel for emitting green light, and a blue-light emitting subpixel for emitting blue light.

As illustrated in FIG. 1 and FIG. 3A, the organic EL display device of Example 1 or of Example 2 to be described subsequently herein is a display device which, when expressed corresponding to the display devices according to the first embodiment, second embodiment and fifth embodiment of the present invention, is provided with:

(A) a plurality of light-emitting devices 10A comprising a first electrode 21, an organic layer 23 including a light-emitting layer 23A and a second electrode 22 to resonate light, which is generated in the light-emitting layer 23A, between a first interface 21A defined by an interface between the first electrode 21 and the organic layer 23 and a second interface 22A defined by an interface between the second electrode 22 and the organic layer 23.

When also expressed corresponding to the display devices according to the first embodiment and second embodiment of the present invention, the organic EL display device is also provided with:

(B) a transparent upper substrate 33 having a first side 33A facing the second electrode 22 and a second side 33B located on an opposite side of the first side 33A, and fixed above the second electrode 22.

Each light-emitting device (organic EL device) 10A in the organic EL display device of Example 1 or the organic EL display devices of Examples 2 to 4 to be described subsequently herein is more specifically provided with:

(a) the first electrode 21, (b) an insulating layer 24 having an opening 25, in a bottom part of which the first electrode 21 is exposed, (c) the organic layer 23 including the light-emitting layer 23A, which is arranged at least on the part of the first electrode 21 exposed in the bottom part of the opening 25, and (d) the second electrode 22.

In Example 1 or in Example 2 to be described subsequently herein, the first electrode 21 is used as an anode electrode while the second electrode 22 is used as a cathode electrode. The first electrode 21 is composed of a light reflecting material, specifically an Al—Nd alloy, and the second electrode is composed of a semi-transparent material, specifically an electrical conductive material containing magnesium (Mg), more specifically an Mg—Ag alloy having a thickness of 10 nm. The first electrode 21 has been formed by a combination of vacuum evaporation and etching. The second electrode 22, on the other hand, has been formed specifically by a film-forming process requiring film-forming particles of small energy such as vacuum evaporation. The results of measurements of the refractive indices of the first electrode 21 and second electrode 22, the results of a measurement of the light reflectance of the first electrode 21 and the results of a measurement of the light transmittance of the second electrode 22 will be shown below in Table 1. The measurements were conducted at 530 nm wavelength.

In Example 1 or in Example 2 to Example 4 to be described subsequently herein, the insulating layer 24 is composed of an insulating material having excellent levelness and a low hygroscopicity to prevent deteriorations of the organic layer 23 with water and to maintain high emission brightness, specifically a polyimide resin. The organic layer 23 is formed, for example, of a stacked structure of a hole transport layer 23B and a light-emitting layer 23A also serving as an electron transport layer 23C, although the organic layer 23 may be shown as a single layer in the drawings.

In Example 1 or in Example 2 to Example 4 to be described subsequently herein, the first electrode 21 which constructs the organic EL device is arranged on an interlayer insulating layer 16 (more specifically, an upper interlayer insulating layer 16B) composed of $SiO_2$ formed by CVD. Further, this interlayer insulating layer 16 covers organic EL device drivers formed on a first substrate 11. Each EL device driver is formed of plural TFTs, and these TFTs and their associated first electrode 21 are electrically connected together via their corresponding contact plug 18, wiring 17 and contact 17A. It is to be noted that in the drawings, one TFT is shown per organic EL device driver. Each TFT is constructed of a gate electrode 12 formed on the first substrate 11, a gate insulating film 13 formed above the first substrate 11 and gate electrode 12, a source/drain region 14 arranged in a semiconductor layer formed on the gate insulating film 13, and a channel-forming region 15 which is a portion of the semiconductor layer, the portion being located between the source/drain regions 14 and above the gate electrode 12. In the illustrated example, each TFT is formed in a bottom gate structure although it may be formed in a top gate structure. The gate electrode 12 of each TFT is connected to a scanning circuit (not shown).

In Example 1 or in Example 2 to Example 4 to be described subsequently herein, an insulating protective film 31 composed of silicon nitride ($Si_{1-x}N_x$) has been arranged by vacuum evaporation to prevent water from reaching the organic layer 23. Over the protective film 31, the transparent upper substrate (which corresponds to the second substrate in the fifth embodiment of the present invention) 33 is arranged. The protective film 31 and the transparent upper substrate 33 are bonded together by an adhesive layer 32 composed of an acrylic adhesive. The measurement results of the refractive indices of the protective film 31 and adhesive layer 32 will also be shown below in Table 1. It is to be noted that the refractive indices are the results of measurements at 530 nm wavelength.

TABLE 1

| | Refractive index | | | |
|---|---|---|---|---|
| | Real part | Imaginary part | Light reflectance | Light transmittance (%) |
| First electrode 21 | 0.755 | 5.466 | 85 | — |
| Second electrode 22 | 0.617 | 3.904 | — | 57 |
| Protective film 31 | 1.87 | 0 | — | — |
| Adhesive layer 32 | 1.53 | 0 | — | — |

In Example 1 or in Example 2 to Example 4 to be described subsequently herein, the first substrate 11, the transparent upper substrate 33, and the second substrate or a transparent lower substrate 35 to be described subsequently herein are composed of soda glass.

Further, the organic EL display device of Example 1 or of Example 2 to be described subsequently herein satisfies the following equation (1-1), equation (1-2), equation (1-3) and equation (1-4) [or equation (3-1), equation (3-2), equation (3-3) and equation (3-4)]:

$$0.7\{-\Phi_1/(2\Pi)+m_1\} \leq 2\times OL_1/\lambda \leq 1.2\{-\Phi_1/(2\Pi)+m_1\} \quad (1\text{-}1),(3\text{-}1)$$

$$0.7\{-\Phi_2/(2\Pi)+m_1\} \leq 2\times OL_2/\lambda \leq 1.2\{-\Phi_2/(2\Pi)+m_2\} \quad (1\text{-}2),(3\text{-}2)$$

$$L_1 < L_2 \quad (1\text{-}3),(3\text{-}3)$$

$$m_1 < m_2 \quad (1\text{-}4),(3\text{-}4)$$

where, $L_1$: Distance from the maximum light-emitting position 23D of the light-emitting layer 23A to the first interface 21A as shown in FIG. 3A, $OL_1$: Optical distance from the maximum light-emitting position 23D of the light-emitting layer 23A to the first interface 21A as shown in FIG. 3A, $L_2$: Distance from the maximum light-emitting position 23D of the light-emitting layer 23A to the second interface 22A as shown in FIG. 3A, $OL_2$: Optical distance from the maximum light-emitting position 23D of the light-emitting layer 23A to the second interface 22A as shown in FIG. 3A, $m_1$, $m_2$: integers, $\lambda$: Wavelength of a maximum peak in a spectrum of light generated in the light-emitting layer 23A (or a desired wavelength in light generated in the light-emitting layer 23A), $\Phi_1$: Phase shift of reflected light occurred at the first interface 21A (unit: radian), with a proviso of $-2\Pi < \Phi_1 \leq 0$, and $\Phi_2$: Phase shift of reflected light occurred at the second interface 22A (unit: radian), with a proviso of $-2\Pi < \Phi_2 \leq 0$.

Figure 5:
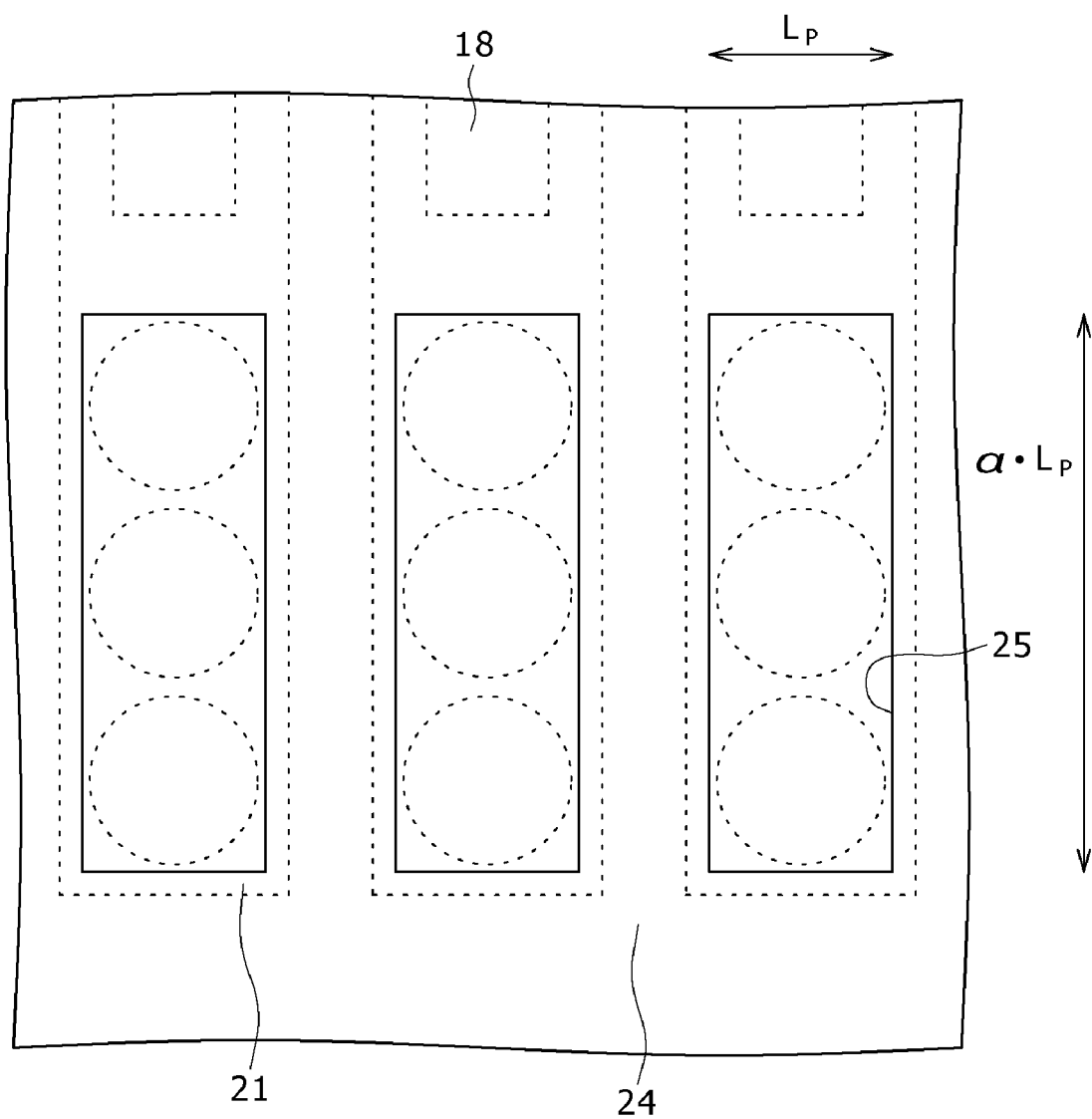
FIG. 5 is a schematic layout diagram of light reflecting portions in the display device of Example 1 or lens portions in a display device of Example 2.

In the organic EL display device of Example 1, light reflecting portions (reflector portions) 40 are formed. Each reflecting portion 40 extends from the first side 33A to an interior of the transparent upper substrate 33, and reflects a portion of light, which is extracted from the light-emitting layer 23A through the second electrode 22 and entered the transparent upper substrate 33, and outputs it from the second side 33B of the transparent upper substrate 33. As illustrated in the schematic layout diagram of FIG. 5 in which circles of broken lines indicate the outer edges of the respective light reflecting portions 40, the plural light reflecting portions 10A are arrayed in stripes, and more than one of light reflecting portions 40 are arranged per light-emitting device 10A. Specifically, when the planar shape of the light-emitting region of each light-emitting device 10A is assumed to be rectangular, the length of one side of such a light-emitting region is assumed to be $L_p$, and the length of another side perpendicularly intersecting the one side is assumed to be $\alpha \times L_p$ (coefficient $\alpha > 1$, $\alpha = 3$ in Example 1), the specific number of more than one of light reflecting portions 40 arranged per light-emitting device 10A is set at the integer part of the coefficient $\alpha$, namely, "3".

Described specifically, each light reflecting portion 40 is formed of a light reflecting layer composed of an Al—Nd layer. Each light reflecting portion 40 can be formed, for example, by such a process that forms a cavity 41 by cutting work in the first side 33A of the transparent upper substrate 33, forms the light reflecting layer, for example, by vacuum evaporation on an exposed surface of the cavity 41, and then fills up the cavity 41 with a filling material 42 composed, for example, of an acrylic resin. It is to be noted that instead of using the filling material 42, the cavity 41 may be filled up with the adhesive layer 32 at the same time as the transparent upper substrate 33 is bonded.

Figure 4:
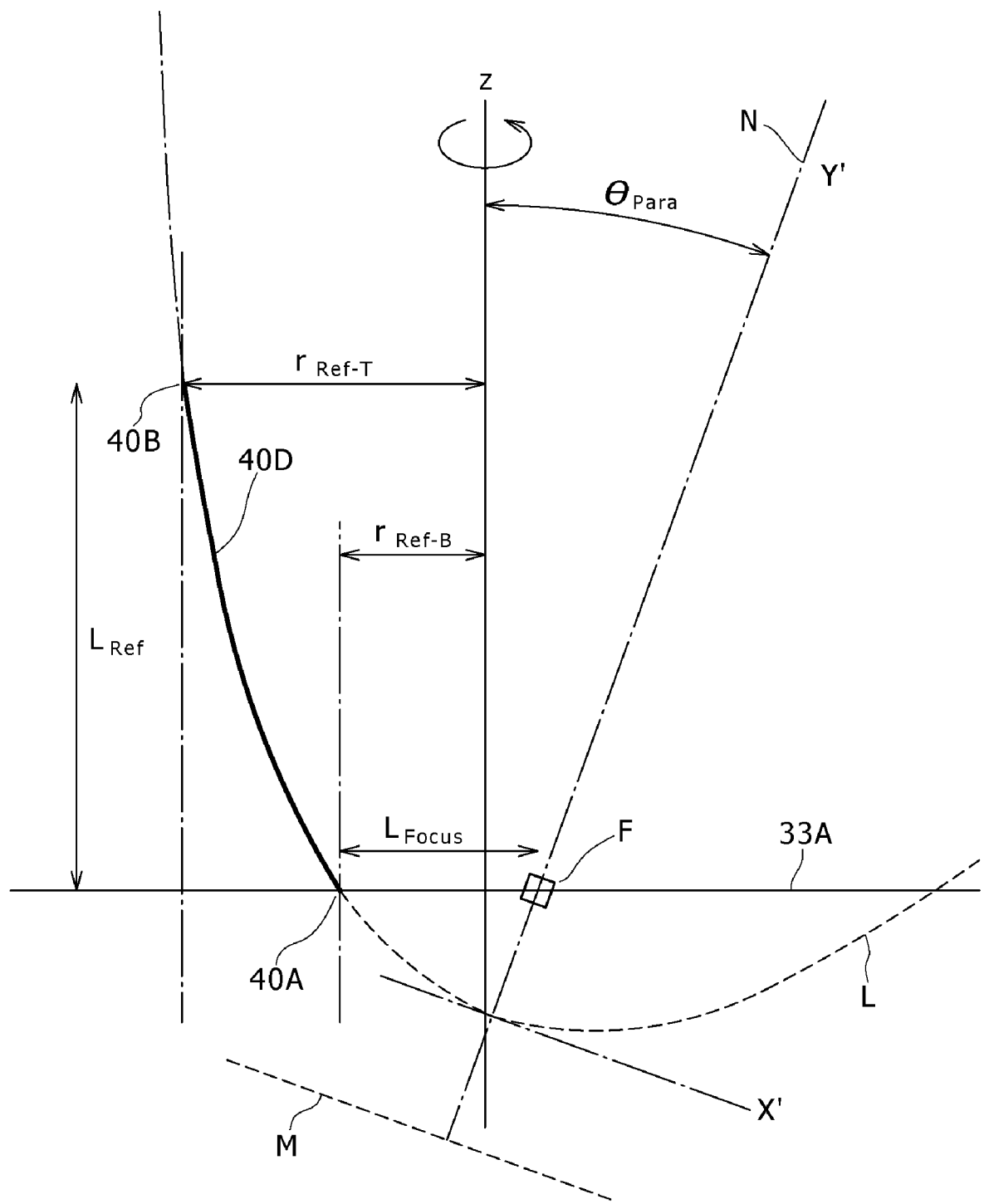
FIG. 4 is a concept diagram of each light reflecting portion in the display device of Example 1.

Concerning the organic EL display device of Example 1, the light reflecting portions 40 are each formed of a part of a surface of a solid revolution as shown in the diagram of FIG. 2 and the concept diagram of FIG. 4. Each light reflecting portion 40 is located at a lower end portion 40A thereof in the first side 33A of the transparent upper substrate 33 and at an upper end portion 40B thereof in the interior of the transparent upper substrate 33, and the upper end portion 40B is in parallel with the second side 33B of the transparent upper substrate 33. Between the lower end portion 40A and the upper end portion 40B, a light reflecting face 40D is formed. When an axis of the light reflecting portion 40 as an axis of revolution of the solid revolution is assumed to be a z-axis, the organic EL display device satisfies the following equation:

$$(r_{Ref\text{-}T}+r_{Ref\text{-}B})/L_{Ref} \leq (n_{Sub\text{-}T}^2-1)^{-1/2}$$

where, $r_{Ref\text{-}B}$: Radius of the lower end portion 40A of the light reflecting portion 40, $r_{Ref\text{-}T}$: Radius of the upper end portion 40B of the light reflecting portion 40, $L_{Ref}$: Distance from the lower end portion 40A to the upper end portion 40B of the light reflecting portion 40 along the z-axis, and $n_{Sub\text{-}T}$: Refractive index of the transparent upper substrate 33.

Specific values of $L_{Ref}$, $r_{Ref\text{-}T}$ and $r_{Ref\text{-}B}$ will be shown below, as examples, in Table 2.

In this case, the light reflecting portion 40 has a cross-sectional shape formed of a part of a parabola L when the light reflecting portion 40 is cut along an imaginary plane including the z-axis. A perpendicular line N drawn from a focal point F of the parabola L to a directrix M is aslant to the z-axis. The organic EL display device of Example 1 satisfies the following equation:

$$0.1 \leq r_{Ref\text{-}B}/L_{Focus} < 0.5$$

where, $L_{Focus}$: Distance from an intersection between the imaginary plane and the lower end portion 40A of the reflecting portion 40 to the focal point F of the parabola L when the light reflecting portion 40 is cut along the imaginary plane.

Further, an angle of inclination $\theta_{Para}$ of the perpendicular line N, which is drawn from the focal point F of the parabola L to the directrix M, to the z-axis satisfies the following equation:

$$\sin(\theta_{Para}) < 1/n_{Sub\text{-}T}$$

where, $n_{Sub\text{-}T}$: Refractive index of the transparent upper substrate 33.

It is to be noted that the focal point F of the parabola L is included in the first side 33A of the transparent upper substrate 33. Assuming a Gaussian coordinate system that the perpendicular line N drawn from the focal point F of the parabola L to the directrix M is a Y'-axis and a perpendicular bisector to a line segment perpendicularly drawn from the focal point F of the parabola L to the directrix M is an X'-axis, and also taking as an example that pixel pitches are 100 μm, the parabola L can be expressed by the following equation:

$$y'=3.57\times10^{-3}x'^2$$

It is to be noted that, even if the value of y' varies within the range of ±5 μm from the equation $y'=k\cdot x'^2$ (k: constant) of the parabola when the shape of the light reflecting portion 40 is analyzed, such a shape should be encompassed by the term "parabola". The same shall also apply in Example 3 to be described subsequently herein.

As an alternative, each light reflecting portion 40 in the organic EL display device of Example 1 is formed of a part of a surface of a solid revolution, the light reflecting portion 40 is located at the lower end portion 40A thereof in the first side 33A of the transparent upper substrate 33 and at the upper end portion 40B thereof in the interior of the transparent upper substrate 33, and the upper end portion 40B of the light reflecting portion 40 is in parallel with the second side 33B of the transparent upper substrate 33. When an axis of the light reflecting portion 40 as an axis of revolution of the solid revolution is assumed to be a z-axis, the organic EL display device of Example 1 satisfies the following equation:

$$\sin(\theta_{0\text{-}2}) > 1/n_{Sub\text{-}T}$$

where, $\theta_{0\text{-}2}$: Angle formed by light, which exits from the second electrode 22, with the z-axis at an intersection between the z-axis and the second electrode 22 on a side of the second electrode 22, and $n_{Sub\text{-}T}$: Refractive index of the transparent upper substrate 33.

TABLE 2

| | |
|---|---|
| $L_{Ref}$ | 81 (μm) |
| $L_{Ref\text{-}T}$ | 50 (μm) |
| $L_{Ref\text{-}B}$ | 30.6 (μm) |
| $L_{Focus}$ | 42 (μm) |
| $\theta_{Para}$ | 41.8 (degrees) |
| $\theta_{0\text{-}2}$ | 41.8 (degrees) |
| $n_{Sub\text{-}T}$ | 1.5 |

In Example 1 or in Example 2 to be described subsequently herein, each organic layer 23 is composed specifically of a red-light emitting organic layer in a red-light emitting organic EL device forming a red-light emitting subpixel, a green-light emitting organic layer in a green-light emitting organic EL device forming a green-light emitting subpixel, and a blue-light emitting organic layer in a blue-light emitting organic EL device forming a blue-light emitting subpixel.

Described specifically, the red-light emitting organic layer is composed, from the side of the first electrode, of:
[Hole injection layer] (thickness: 10 nm):
"LGHIL" (trade name, product of LG Chemical Ltd.)
[Hole transport layer] (thickness: 26 nm):
"HT320" (trade name, product of Idemitsu Kosan Co., Ltd.)
[Light-emitting layer] (thickness: 50 nm):
"RHOOL" (trade name, product of Idemitsu Kosan Co., Ltd.) and
"D125" (0.5% doped) (trade name, product of Toray Industries, Inc.)
[Electron transport layer] (thickness: 220 nm):
"ET085" (trade name, product of Idemitsu Kosan Co., Ltd.)
It is to be noted that the maximum light-emitting position is located at the interface between the electron transport layer and the light-emitting layer.

The green-light emitting organic layer is composed, from the side of the first electrode, of:
[Hole injection layer] (thickness: 10 nm):
"LGHIL" (trade name, product of LG Chemical Ltd.)
[Hole transport layer] (thickness: 35 nm):
"HT320" (trade name, product of Idemitsu Kosan Co., Ltd.)

[Light-emitting layer] (thickness: 30 nm):
"BH232" and "GD206" (10% doped) (trade names, products of Idemitsu Kosan Co., Ltd.)
[Electron transport layer] (thickness: 175 nm):
"ETS085" (trade name, product of Idemitsu Kosan Co., Ltd.)
It is to be noted that the maximum light-emitting position is located at the interface between the hole transport layer and the light-emitting layer.

The blue-light emitting organic layer is composed, from the side of the first electrode, of:
[Hole injection layer] (thickness: 10 nm):
"LGHIL" (trade name, product of LG Chemical Ltd.)
[Hole transport layer] (thickness: 24 nm):
"HT320" (trade name, product of Idemitsu Kosan Co., Ltd.)
[Light-emitting layer] (thickness: 30 nm):
"BH232" and "BD218" (10% doped) (trade names, products of Idemitsu Kosan Co., Ltd.)
[Electron transport layer] (thickness: 141 nm):
"ET085" (trade name, product of Idemitsu Kosan Co., Ltd.)
It is to be noted that the maximum light-emitting position is located at the interface between the hole transport layer and the light-emitting layer.

Values of $\lambda$, $L_1$, $OL_1$, $2OL_1/\lambda$, $L_2$, $OL_2$, $2OL_2/\lambda$, $n_{ave}$, $\{-2\Phi_1/(2\Pi)+m_1\}$, $\{-2\Phi_2/(2\Pi)+m_2\}$ will be shown below, as examples, in Table 3. It is, however, to be noted that $m_1=0$ and $m_2=1$.

TABLE 3

| | Unit | Red-light emitting organic layer | Green-light emitting organic layer | Blue-light emitting organic layer |
|---|---|---|---|---|
| $\lambda$ | nm | 620 | 530 | 460 |
| $L_1$ | nm | 86 | 45 | 34 |
| $OL_1$ | nm | 155 | 82 | 64 |
| $2OL_1/\lambda$ | | 0.495 | 0.310 | 0.280 |
| $L_2$ | nm | 220 | 205 | 171 |
| $OL_2$ | nm | 393 | 374 | 324 |
| $2OL_2/\lambda$ | | 1.267 | 1.413 | 1.408 |
| $n_{ave}$ | | 1.786 | 1.826 | 1.893 |
| $-\Phi_1/(2\pi) + m_1$ | | 0.412 | 0.395 | 0.372 |
| $-\Phi_2/(2\pi) + m_2$ | | 1.355 | 1.336 | 1.408 |

Figure 3B:
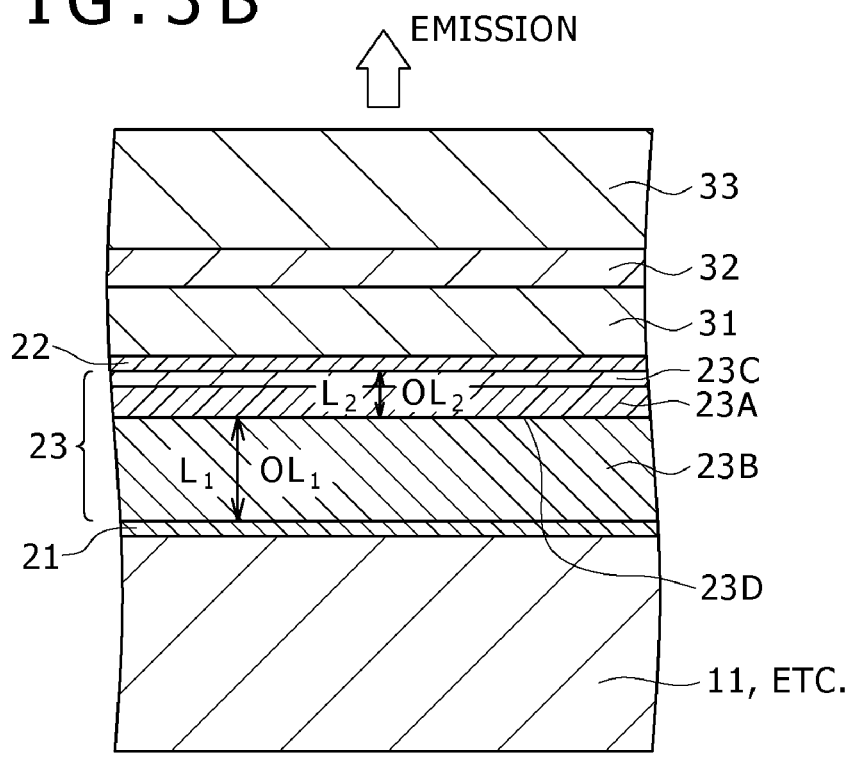
FIG. 3B is a schematic fragmentary diagram of an organic layer and other layers in a display device of Comparative Example 1.

A description will hereinafter be made of details on the light-emitting devices 10A in the organic EL display device of Example 1. For the sake of a comparison with the conditions of $m_1=0$ and $m_2=1$ in Example 1, light-emitting devices under the conditions of $m_1=1$ and $m_2=0$ will be discussed as Comparative Example 1. A schematic diagram of an organic layer and the like in each light-emitting device of Comparative Example 1 is shown in FIG. 3B. As illustrated in FIGS. 3A and 3B, light is generated on the side of the first interface in Example 1 but on the side of the second interface in Example 2.

Figure 11:
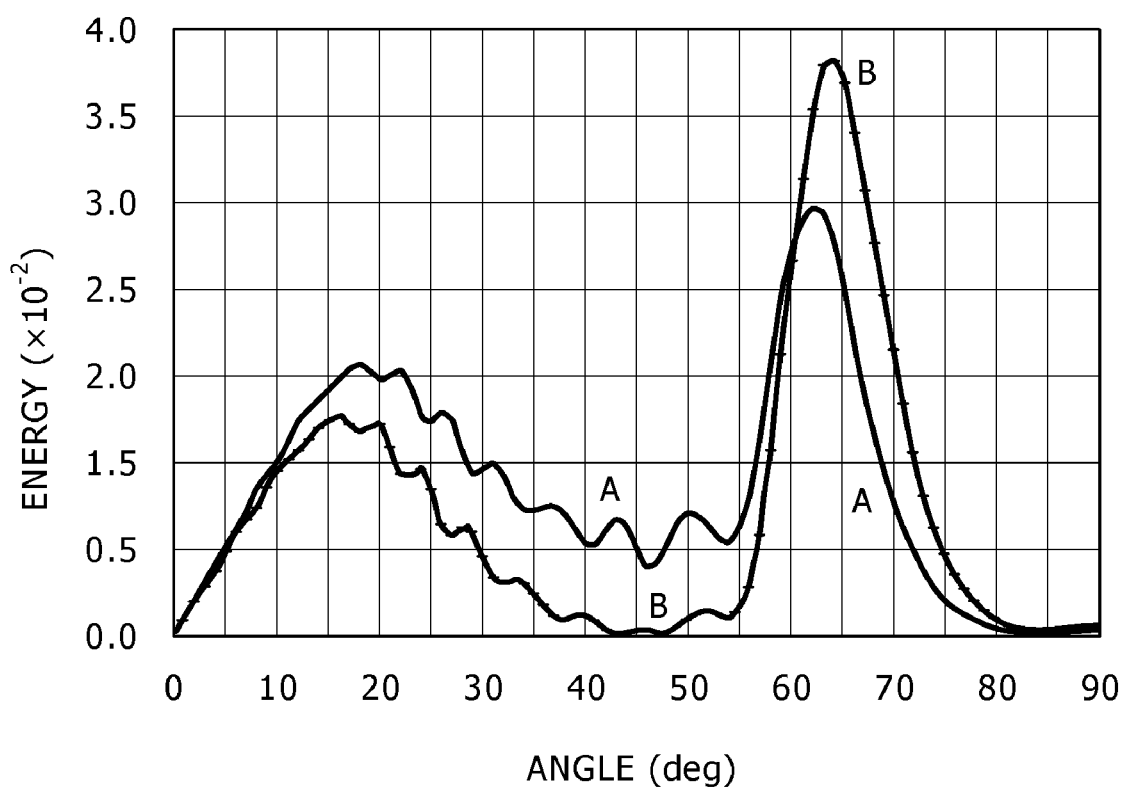
FIG. 11 is a graph showing the calculation results of luminous energy distributions in protective films formed of silicon nitride ($Si_{1-x}N_x$) in Example 1 and Comparative Example 1, respectively.

FIG. 11 shows the calculation results of luminous energy distributions in the protective films 31 formed of silicon nitride ($Si_{1-x}N_x$) in Example 1 and Comparative Example 1, respectively. The luminous energy distribution obtained by Example 1 is indicated by curve "A", while the luminous energy distribution obtained by Comparative Example 1 is designated by curve "B". Plotted along the abscissas in FIG. 11 are angles which light, which is traveling through the protective film 31, forms with a normal to a top surface of the protective film 31 when the light strikes the top surface of the protective film 31. For the sake of convenience, these angles will each be called "the angle of a travel through the protective film". A luminous energy distribution can be obtained by calculating the efficiency of a light output into a desired medium under resonation (interference) at every wavelength, multiplying the efficiency of the light output with the intensity of a light emission in the medium to obtain a luminous intensity, integrating the luminous intensity over the entire range of wavelengths, and calculating the total energy at a specific angle.

The refractive index of silicon nitride ($Si_{1-x}N_x$) is about 1.8, and the refractive index of the transparent upper substrate 33 is about 1.45. It is, therefore, understood from FIG. 11 that light, the angle of a travel of which through the protective film is up to about 34 degrees, can exit into air from the protective film 31 via the transparent upper substrate 33 without needing the arrangement of the light reflecting portion or a lens portion to be described subsequently herein. On the other hand, light, the angle of a travel of which through the protective film is from 34 degrees to 53 degrees, enters the adhesive layer 32 and transparent upper substrate 33 from the protective film 31, but undergoes a total reflection at the interface between the transparent upper substrate 33 so that the light cannot exit into air.

Further, light, the angle of a travel of which through the protective film is greater than 53 degrees, undergoes a total reflection at the interface between the protective film and the adhesive layer 32 and can enter neither the adhesive layer 32 nor the transparent upper substrate 33. Accordingly, the light which is bent in traveling path by the light reflecting portion or the below-mentioned lens portion and contributes to an improvement in the efficiency of light output is the light the angle of a travel of which through the protective film is from 34 degrees to 53 degrees.

It is also understood from FIG. 11 that, with respect to light the angle of an advance of which through the protective film is from 34 degrees to 54 degrees, Example 1 has a significantly higher luminous energy distribution in comparison with Comparative Example 1. Owing to the arrangement of light reflecting portions or lens portions, Example 1 is hence greater in the energy of light, which exits from the transparent upper substrate 33 (the energy of available light), than Comparative Example 1. It has been found necessary, upon studying the overall cavity effects, to consider that the overall cavity effects are in the mode that three kinds of effects, that is, cavity effects at the opposite end portions of the reflecting interface (order: m), interference effects (order: $m_1$) on the side of the first interface and interference effects (order: $m_2$) on the side of the second interface are combined together. In other words, when the interference orders $m_1$ and $m_2$ are $0^{th}$, the conditions are such that light beams intensify each other only in the direction of the normal, and there are no conditions that allow light beams to intensify each other in any other direction. When $m_1$ and $m_2$ are $1^{st}$, on the other hand, the conditions are such that light beams also intensify each other in an oblique direction of from 62 degrees to 64 degrees in addition to the direction of the normal, resulting in more light energy which cannot be outputted into air even by the light reflecting portions (reflector portions). As the effects of interference increase with the reflectance, a reduction in the order of interference on the side of higher reflectances makes it possible to output more light by the light reflecting portions (reflector portions).

Figure 12:
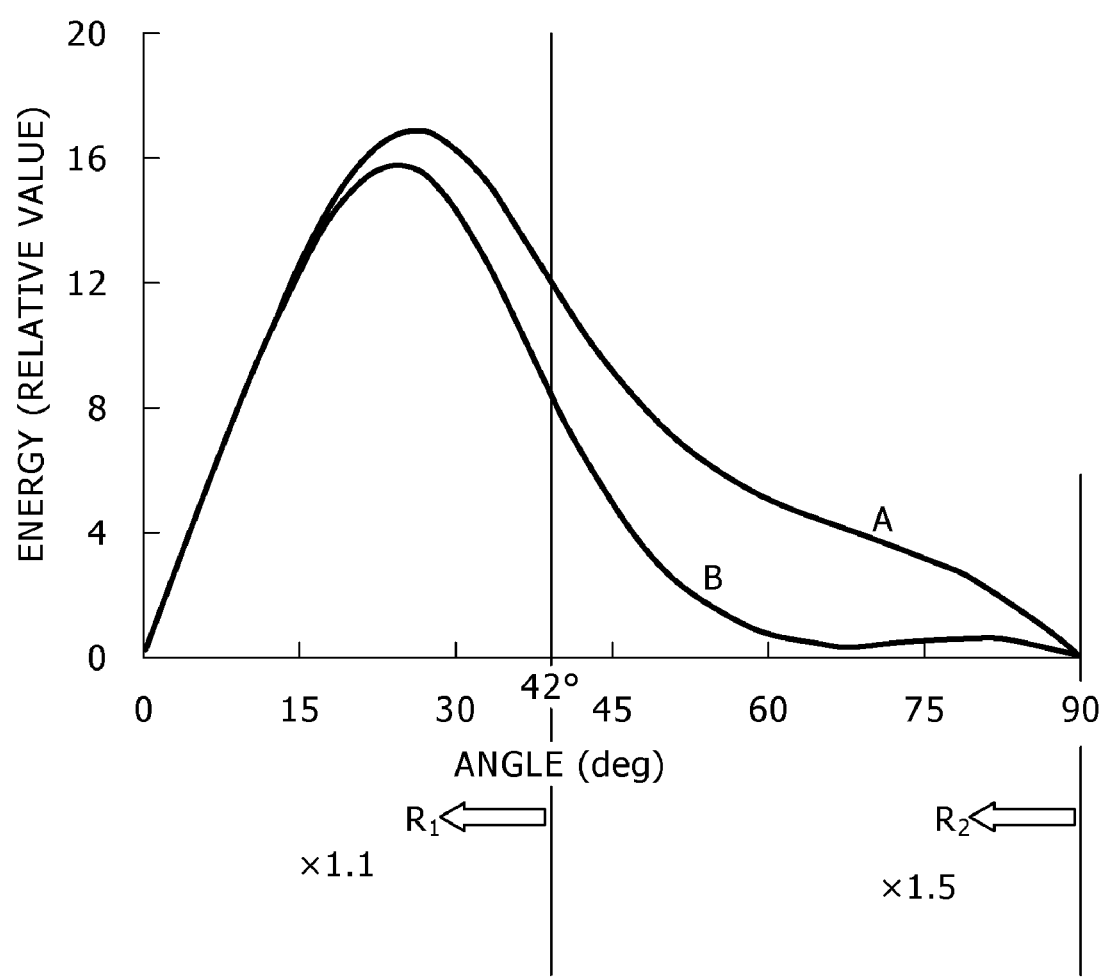
FIG. 12 is a graph showing the calculation results of luminous energy distributions of light outputted from protective films into adhesive layers in Example 1 and Comparative Example 1, respectively.

To permit accurate estimates, the calculation results of luminous energy distributions of light outputted from protective film 31 into the adhesive layer (refractive index: about 1.5) are shown in FIG. 12. A luminous energy distribution obtained by Example 1 is indicated by curve "A", while a luminous energy distribution obtained by Comparative Example 1 is designated by curve "B". Arrow $R_1$ indicates a range in which light can be outputted into air without light reflecting portions, while arrow $R_2$ designates a range in which light can be outputted into air with light reflecting portions.

Figure 13A:
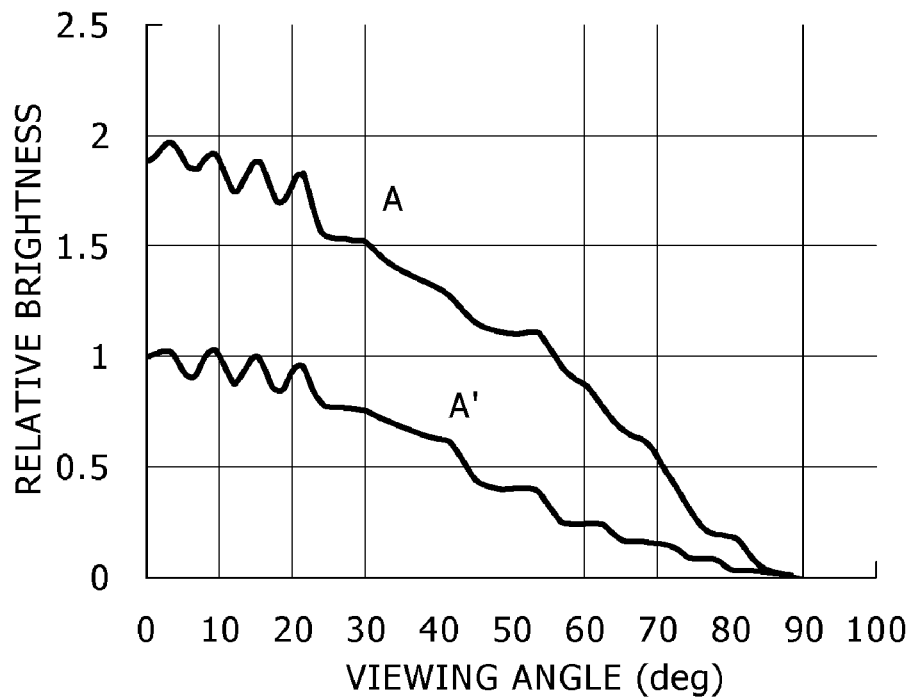
FIG. 13A is a graph showing the dependency of relative brightness on viewing angle in Example 1.
Figure 13B:
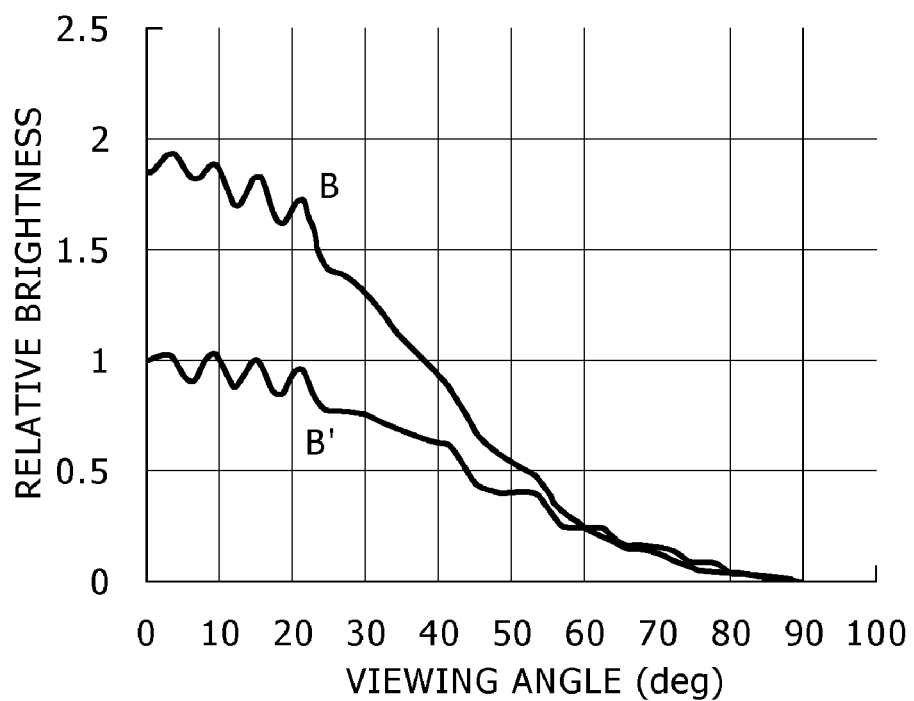
FIG. 13B is a graph showing the dependency of relative brightness on viewing angle in Comparative Example 1.

When an organic EL display device is constructed in combination with light reflecting portions or lens portions that improves the efficiency of light output, the luminous energy to be outputted can, therefore, be substantially increased to reduce the power consumption by generating light on a side closer to the light reflecting electrode of high reflectance and choosing suitable resonation or interference conditions. As illustrated in FIGS. 13A and 13B, an organic EL display device excellent in viewing angle characteristics can also be realized even when the brightness in the direction of a normal (the brightness at the viewing angle of 0 degree) is the same. FIG. 13A shows relative brightness data in Example 1. In FIG. 13A, curve "A" indicates data of an organic EL display device equipped with light reflecting portions 40, while curve "A'" designates, for the purpose of reference, data of an organic EL display device not equipped with the light reflecting portions 40. FIG. 13B shows relative brightness data in Comparative Example 1. In FIG. 13B, curve "B" indicates data of an organic EL display device equipped with light reflecting portions 40, while curve "B'" designates, for the purpose of reference, data of an organic EL display device not equipped with the light reflecting portions 40. It is to be noted that the graphs in FIGS. 13A and 13b were each obtained by performing a tracing simulation with respect to light entered each light reflecting portion in accordance with the luminous energy distribution obtained in FIG. 12, calculating the energy-angle distribution of light to be finally outputted into air via the light reflecting portion, and then converting the distribution into brightness data.

For the sake of comparison, an organic EL display device having light reflecting portions, which satisfied $r_{Ref-B}=L_{Focus}/2$, was fabricated on a trial basis (Comparative Example 2). Light reflecting portions which satisfy such conditions are called "compound parabolic concentrators (CPCs)". Also fabricated on a trial basis was an organic EL display device having light reflecting portions in each of which a perpendicular light drawn from the focal point of a parabola to a directrix coincided with a z-axis (Comparative Example 3). The values of $L_{Ref}$, $r_{Ref-T}$ and $r_{Ref-B}$ in Comparative Examples 2 and 3 were set at the same values in Example 1. The values of light output energy, front brightness (brightness at the viewing angle of 0 degree) and brightness at the viewing angle of 45 degrees in Example 1 were all set at 1.00. Their corresponding values in Comparative Example 2 and Comparative Example 3 will be shown below, together with the preset values in Example 1, in Table 4.

TABLE 4

|  | Ex. 1 | Comp Ex. 2 | Comp Ex. 3 |
|---|---|---|---|
| Light output energy | 1.00 | 0.88 | 0.75 |
| Brightness at 0-degree viewing angle | 1.00 | 0.84 | 0.95 |
| Brightness at 45-degree viewing angle | 1.00 | 0.95 | 0.75 |

EXAMPLE 2

Figure 6:
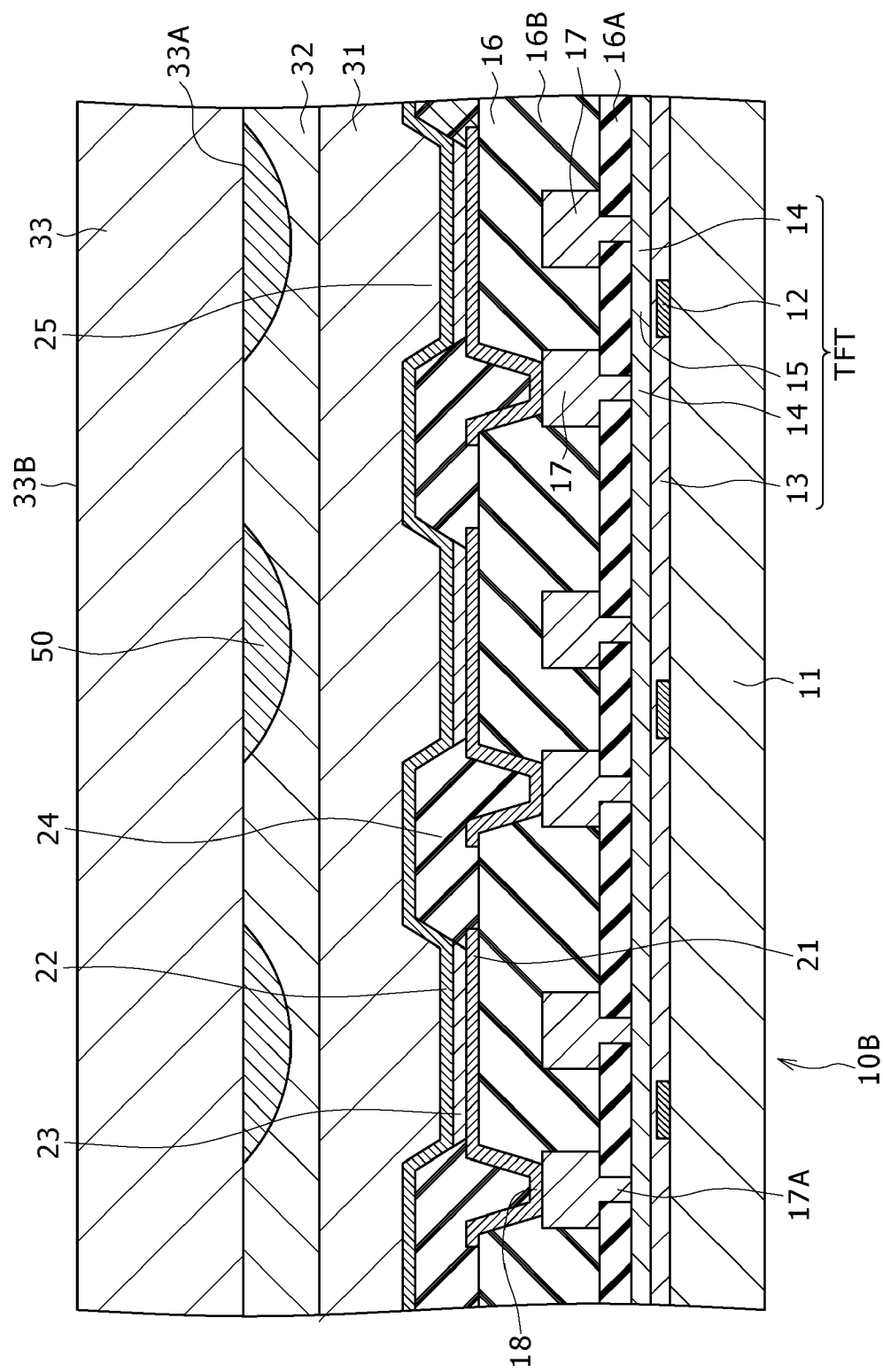
FIG. 6 is a schematic fragmentary cross-sectional view of the display device of Example 2.
Figure 7:
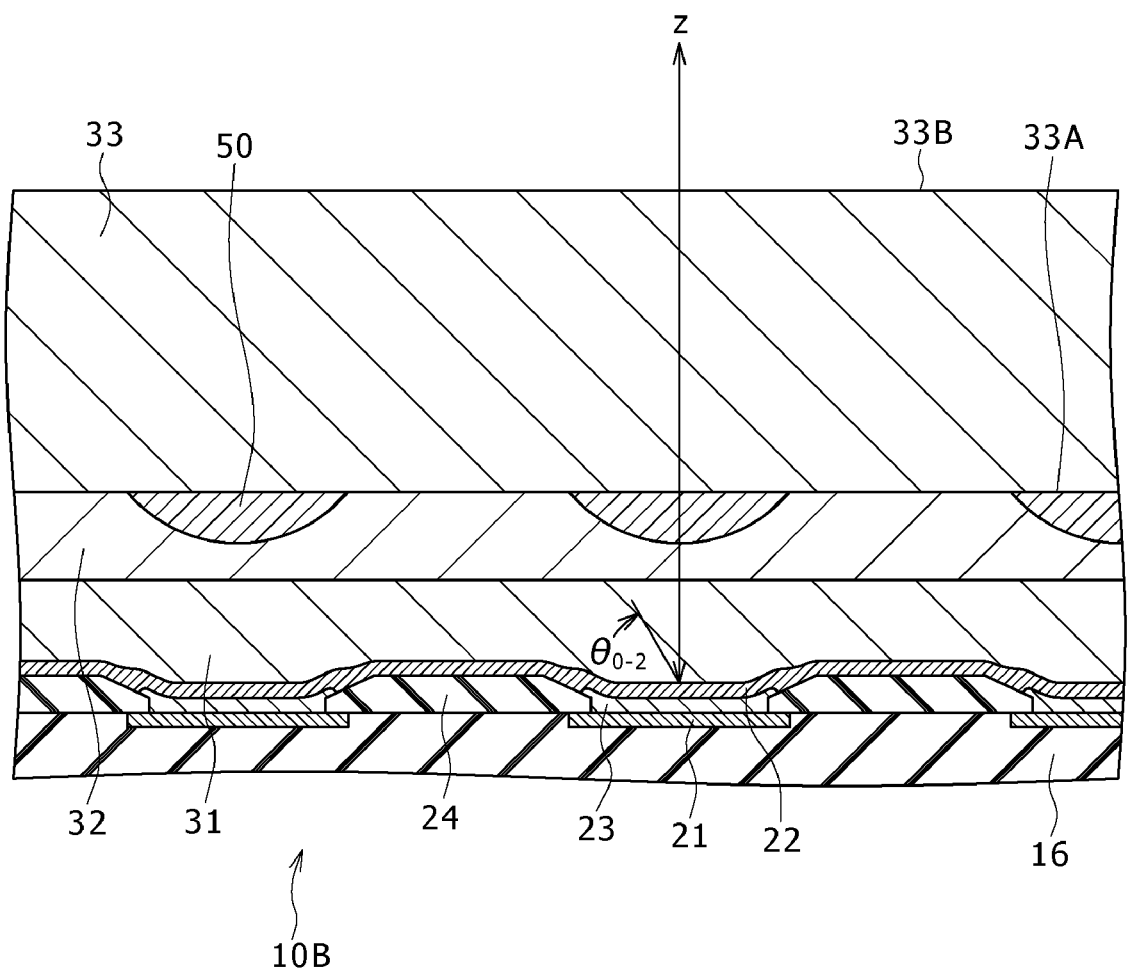
FIG. 7 is a schematic fragmentary cross-sectional view of lens portions in the display device of Example 2.

Example 2 relates to a display device with which the second embodiment and fifth embodiment of the present invention are concerned, and specifically to an organic EL display device. The organic EL display device of Example 2 is shown, as a schematic fragmentary cross-sectional view, in FIG. 6, and a schematic fragmentary cross-sectional view of its lens portions is depicted in FIG. 7. A concept diagram of an organic layer is similar to that illustrated in FIG. 3A. The organic EL display device of Example 2 is also an organic EL color display device of the active matrix type, and is also of the surface-emitting type. Namely, light is outputted through a second electrode which corresponds to an upper electrode.

In the organic EL display device of Example 2, lens portions 50 are formed on the first side 33A of the transparent upper substrate 33 such that light, which is extracted from the light-emitting layer 23A through the second electrode 22, is allowed to pass through the lens portions 50. Similar to the light-emitting devices 10A illustrated in the schematic layout diagram of FIG. 5, plural light-emitting devise 10B are arrayed in stripes, and more than one of lens portions 50 are arranged per light-emitting device 10B. Specifically, when the planar shape of the light-emitting region of each light-emitting device 10B is assumed to be rectangular, the length of one side of such a light-emitting region is assumed to be $L_p$, and the length of another side perpendicularly intersecting the one side is assumed to be $\alpha \times L_p$ (coefficient $\alpha>1$, $\alpha=3$ in Example 2), the specific number of lens portions 50 arranged per light-emitting device 10B is set at the integer part of the coefficient $\alpha$, namely, "3". Further, the lens portions 50 are composed of planoconvex lenses formed by a well-known method. The same shall apply in Example 4 to be described subsequently herein.

As depicted in the schematic view of lens portions in FIG. 7, each lens portion 50 is composed of a convex lens in the organic EL display device of Example 2. When an axis of the lens portion 50 as an optic axis is assumed to be a z-axis, the organic EL display device of Example 2 satisfies the following equation:

$$\sin(\theta_{0-2}) > 1/n_{Sub-T}$$

where, $\theta_{0-2}$: Angle formed by light, which exits from the second electrode 22, with the z-axis at an intersection between the z-axis and the second electrode 22 on a side of the second electrode 22, and $n_{Sub-T}$: Refractive index of the transparent upper substrate 33.

The value of $\theta_{0-2}$ and that of $n_{Sub-T}$ are as shown in Table 2.

EXAMPLE 3

Figure 8:
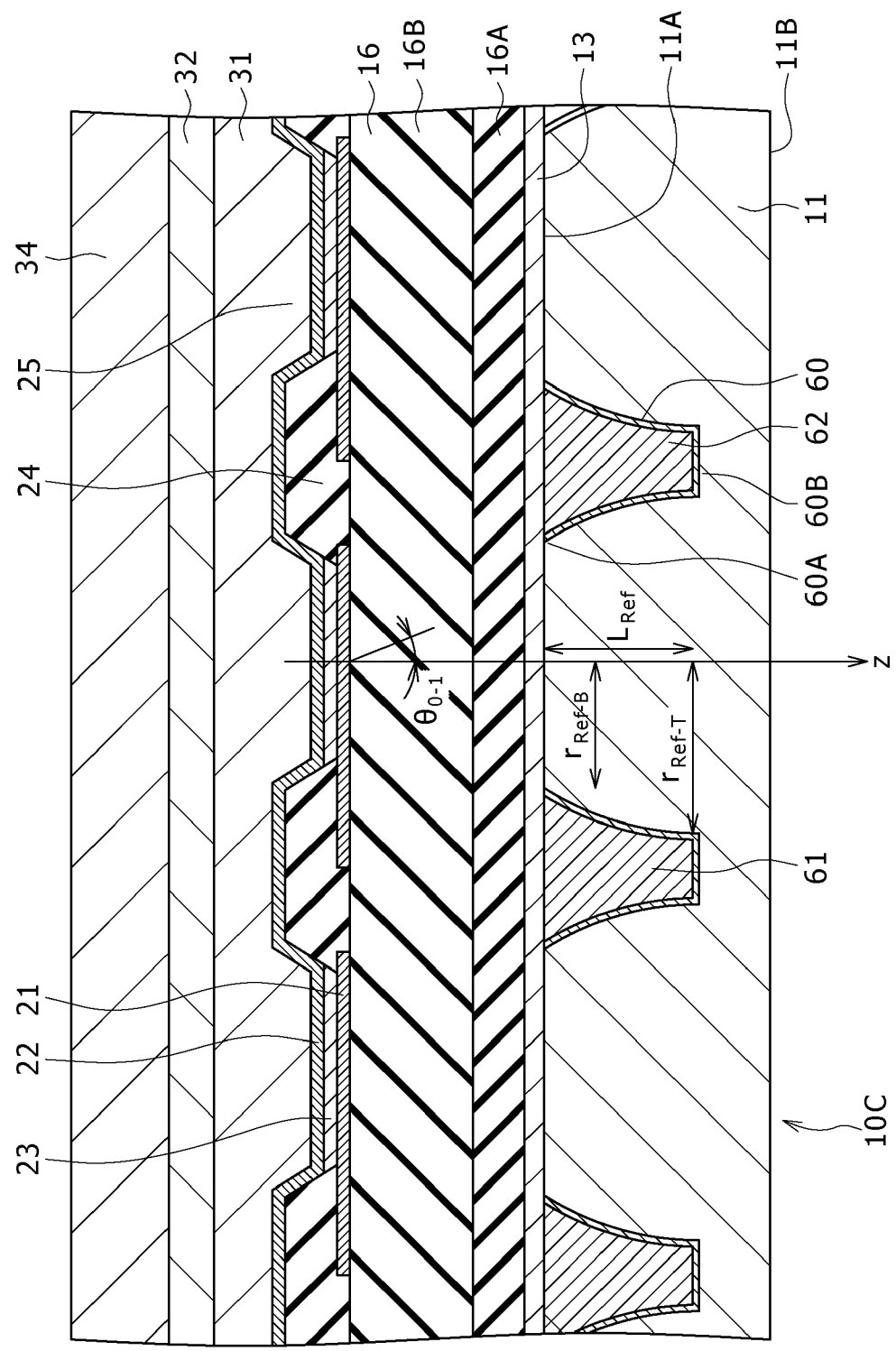
FIG. 8 is a schematic fragmentary cross-sectional view of a display device of Example 3.
Figure 9:
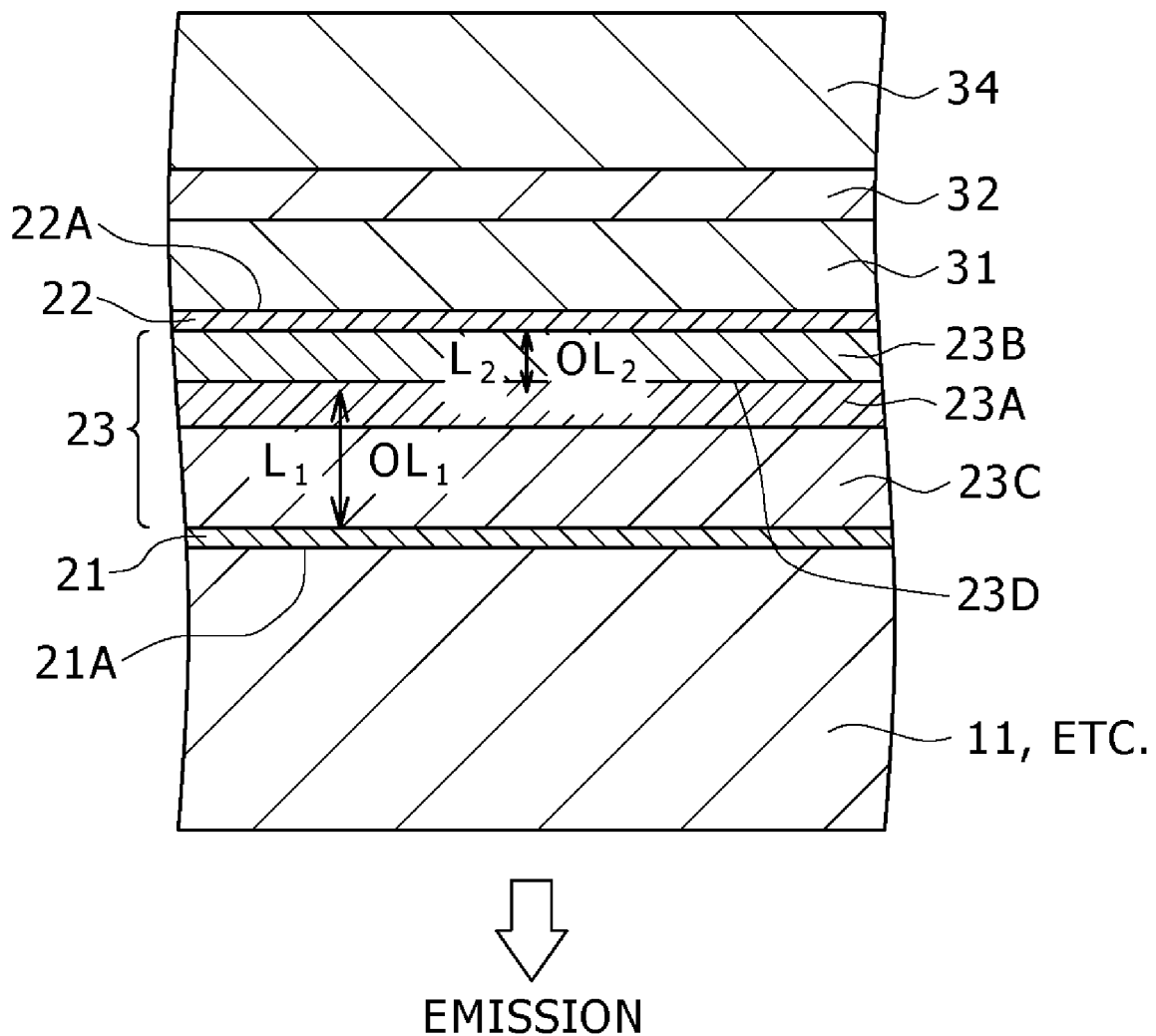
FIG. 9 is a schematic fragmentary cross-sectional view of an organic layer and other layers in the display device of Example 3.

Example 3 relates to a display device with which the third embodiment of the present invention is concerned, and specifically to an organic EL display device. A schematic fragmentary cross-sectional view of the organic EL display device of Example 3 is shown in FIG. 8, and a schematic fragmentary cross-sectional view of its organic layer and the like is depicted in FIG. 9. The organic EL display device of Example 3 is also an organic EL color display device of the active matrix type, but is of the bottom-emitting type. Namely, light is outputted through a first electrode which corresponds to a lower electrode.

The organic EL display device of Example 3 or of Example 4 to be described subsequently herein is provided with:

(A) a transparent lower substrate having a first side 11A and a second side 11B located on an opposite side of the first side 11A (in Example 3, a first substrate 11 also serves as the transparent lower substrate), and (B) a plurality of light-emitting devices 10C or 10D arranged on the first side 11A of the transparent lower substrate (first substrate 11), and comprises a first electrode 21, an organic layer 23 including a light-emitting layer 23A and a second electrode 22 to resonate light, which is generated in the light-emitting layer 23A, between a first interface 21A defined by an interface between the first electrode 21 and the organic layer 23 and a second interface 22A defined by an interface between the second electrode 22 and the organic layer 23.

Figure 10:
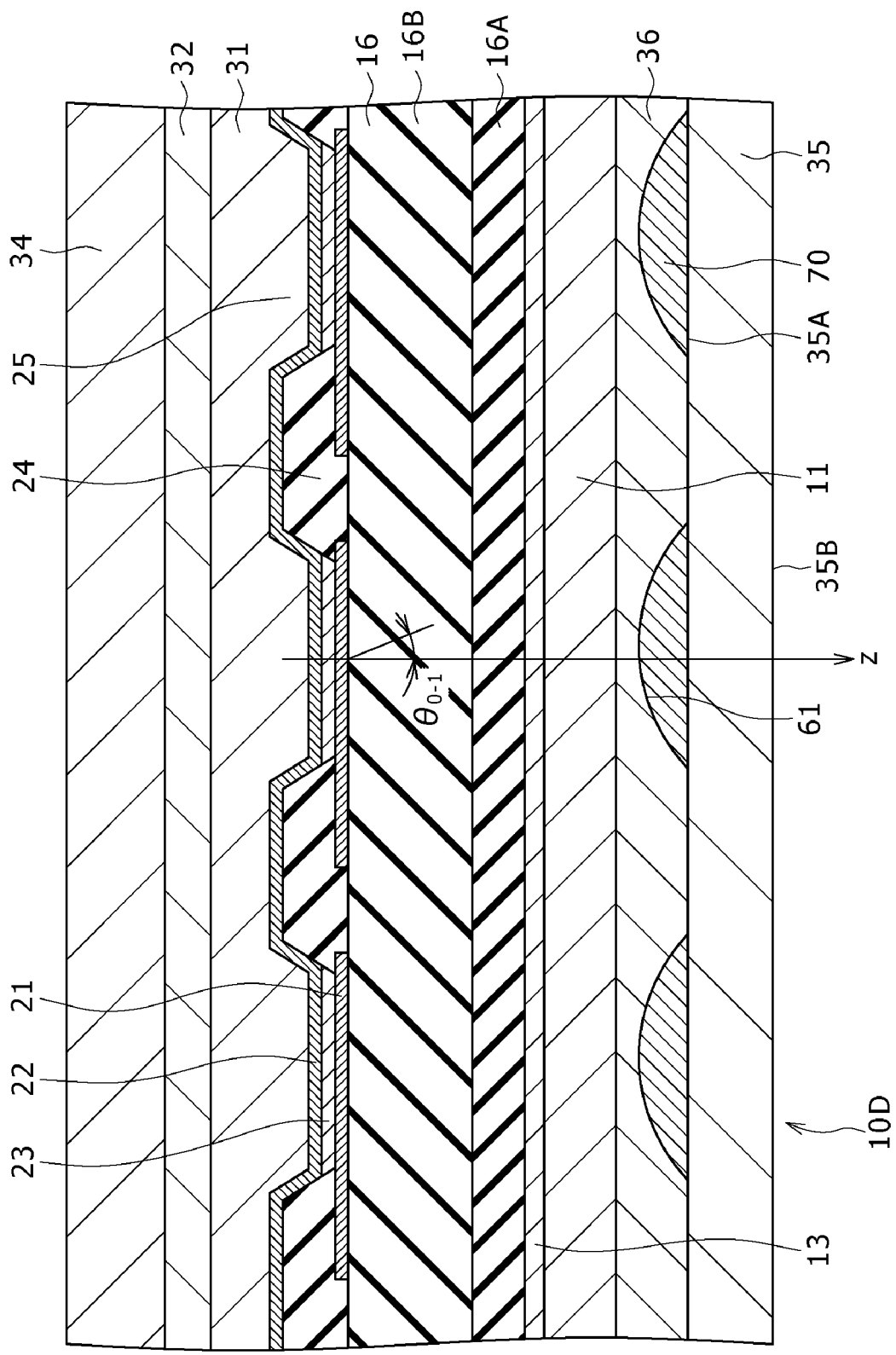
FIG. 10 is a schematic fragmentary cross-sectional view of a display device of Example 4.

In the bottom-emitting display device of Example 3 or of Example 4 to be described subsequently herein, an interlayer insulating layer 16 needs to be formed with a material transparent to light from the light-emitting devices 10C or 10D, and light-emitting device drivers need to be formed such that they do not block light from the light-emitting devices 10C or 10D. In FIGS. 8 and 10, illustration of the light-emitting device drivers is omitted. Further, a protective film 31 and a second substrate 34 are bonded together by an adhesive layer 31 made of an acrylic adhesive.

In Example 3 and in Example 4 to be described subsequently herein, the second electrode 22 is used as an anode electrode while the first electrode 21 is used as a cathode electrode. The second electrode 22 is formed of a light reflecting material, specifically an Al-ND alloy, and the first electrode 21 is formed of a semi-transparent material, specifically an electrical conductive material containing magnesium (Mg), more specifically an Mg—Ag alloy of 10 nm thickness. The second electrode 22 has been formed by a film-forming process requiring film-forming particles of smaller energy such as vacuum evaporation. On the other hand, the first electrode 21 has been formed by a combination of vacuum evaporation and etching. As a result of measurements of the refractive indices of the first electrode 21 and second electrode 22, the measurement result of the average light reflectance of the first electrode 21 and the measurement result of the average light transmittance of the second electrode 22 were found to be similar to those shown in Table 1. In Table 1, however, "the first electrode 21" should be read as "the second electrode 22", and the "second electrode 22" should be read as "the first electrode 21".

Further, the organic EL display device of Example 1 or of Example 4 to be described subsequently herein satisfies the following equation (2-1), equation (2-2), equation (2-3) and equation (2-4):

$$0.7\{-\Phi_1/(2\Pi)+m_1\} \leq 2 \times OL_1/\lambda \leq 1.2\{-\Phi_1/(2\Pi)+m_1\} \quad (2\text{-}1)$$

$$0.7\{-\Phi_2/(2\Pi)+m_2\} \leq 2 \times OL_2/\lambda \leq 1.2\{-\Phi_2/(2\Pi)+m_2\} \quad (2\text{-}2)$$

$$L_1 > L_2 \quad (2\text{-}3)$$

$$m_1 > m_2 \quad (2\text{-}4)$$

where, $L_1$: Distance from a maximum light-emitting position 23D of the light-emitting layer 23A to the first interface 21A as shown in FIG. 9, $OL_1$: Optical distance from the maximum light-emitting position 23D of the light-emitting layer 23A to the first interface 21A as shown in FIG. 9, $L_2$: Distance from the maximum light-emitting position 23D of the light-emitting layer 23A to the second interface 22A as shown in FIG. 9, $OL_2$: Optical distance from the maximum light-emitting position 23D of the light-emitting layer 23A to the second interface 22A as shown in FIG. 9, $m_1$, $m_2$: integers, $\lambda$: Wavelength of a maximum peak in a spectrum of light generated in the light-emitting layer 23A (or a desired wavelength in light generated in the light-emitting layer 23A), $\Phi_1$:

Phase shift of reflected light occurred at the first interface 21A (unit: radian), with a proviso of $-2\Pi < \Phi_1 \leq 0$, and $\Phi_2$: Phase shift of reflected light occurred at the second interface 22A (unit: radian), with a proviso of $-2\Pi < \Phi_2 \leq 0$.

In the organic EL display device of Example 3, light reflecting portions (reflector portions) 60 are formed. Each reflecting portion 60 extends from the first side 11A to an interior of the transparent lower substrate (first substrate 11), and reflects a portion of light, which is extracted from the light-emitting layer 23A through the first electrode 21 and entered the transparent lower substrate (first substrate 11), and outputs it from the second side 11B of the transparent lower substrate (first substrate 11). Similar to the light-emitting devices illustrated in the schematic layout diagram of FIG. 5, more than one of light reflecting portions 10C are arrayed in stripes, and plural light reflecting portions 60 are arranged per light-emitting device 10C. Specifically, when the planar shape of the light-emitting region of each light-emitting device 10C is assumed to be rectangular, the length of one side of such a light-emitting region is assumed to be $L_p$, and the length of another side perpendicularly intersecting the one side is assumed to be $\alpha \times L_p$ (coefficient $\alpha 22$ 1, $\alpha=3$ in Example 3), the specific number of light reflecting portions 60 arranged per light-emitting device 10C is set at the integer part of the coefficient $\alpha$, namely, "3".

Described specifically, each light reflecting portion 60 is formed of a light reflecting layer composed of an Al—Nd layer. Each light reflecting portion 60 can be formed, for example, by such a process that forms a cavity 61 by cutting work in the first side 11A of the first substrate 11, forms the light reflecting layer, for example, by vacuum evaporation on an exposed surface of the cavity 61, and then fills up the cavity 61 with a filling material 62 composed, for example, of an acrylic resin or with a gate insulating film 13.

Concerning the organic EL display device of Example 3, the light reflecting portions 60 are each formed of a part of a surface of a solid revolution. Each light reflecting portion 60 is located at a lower end portion 60A thereof in the first side 11A of the transparent lower substrate (first substrate 11) and at an upper end portion 60B thereof in the interior of the transparent lower substrate (first substrate 11), and the upper end portion 60B is in parallel with the second side 11B of the transparent lower substrate (first substrate 11). When an axis of the light reflecting portion 60 as an axis of revolution of the solid revolution is assumed to be a z-axis, the organic EL display device satisfies the following equation:

$$(r_{Ref\text{-}T}+r_{Ref\text{-}B})/L_{Ref} \leq (n_{Sub\text{-}T}^2-1)^{-1/2}$$

where, $r_{Ref\text{-}B}$: Radius of the lower end portion 60A of the light reflecting portion 60, $r_{Ref\text{-}T}$: Radius of the upper end portion 60B of the light reflecting portion 60, $L_{Ref}$: Distance from the lower end portion 60A to the upper end portion 60B of the light reflecting portion 60 along the z-axis, and $n_{Sub\text{-}T}$: Refractive index of the transparent upper substrate.

Specific values of $L_{Ref}$, $r_{Ref\text{-}T}$ and $r_{Ref\text{-}B}$ are as shown in Table 2.

In this case, similar to the reflecting portion shown in FIG. 4, the light reflecting portion 60 has a cross-sectional shape formed of a part of a parabola L when the light reflecting portion 60 is cut along an imaginary plane including the z-axis. A perpendicular line drawn from a focal point of the parabola to a directrix is aslant to the z-axis. The organic EL display device of Example 3 satisfies the following equation:

$$0.1 \leq r_{Ref\text{-}B}/L_{Focus} < 0.5$$

where, $L_{Focus}$: Distance from an intersection between the imaginary plane and the lower end portion 60A of the reflecting portion 60 to the focal point of the parabola when the light reflecting portion 60 is cut along the imaginary plane Further, an angle of inclination $\theta_{Para}$ of the perpendicular line, which is drawn from the focal point of the parabola to the directrix, to the z-axis satisfies the following equation:

$$\sin(\theta_{Para}) < 1/n_{Sub-B}$$

where, $n_{Sub-B}$: Refractive index of the transparent lower substrate (first substrate 11).

It is to be noted that the focal point of the parabola is included in the first side 11A of the transparent lower substrate (first substrate 11). Assuming a Gaussian coordinate system that the perpendicular line drawn from the focal point of the parabola to the directrix is a Y'-axis and a perpendicular bisector to a line segment perpendicularly drawn from the focal point of the parabola to the directrix is an X'-axis, and also taking as an example that pixel pitches are 100 µm, the parabola can be expressed by the following equation:

$$y' = 3.57 \times 10^{-3} \cdot x'^2$$

As an alternative, each light reflecting portion 60 in the organic EL display device of Example 3 is formed of a part of a surface of a solid revolution, the light reflecting portion 60 is located at the lower end portion 60A thereof in the first side 11A of the transparent lower substrate (first substrate 11) and at the upper end portion 60B thereof in the interior of the transparent lower substrate (first substrate 11), and the upper end portion 60B of the light reflecting portion 60 is in parallel with the second side 11B of the transparent lower substrate (first substrate 11). When an axis of the light reflecting portion 60 as an axis of revolution of the solid revolution is assumed to be a z-axis, the organic EL display device of Example 3 satisfies the following equation:

$$\sin(\theta_{0-1}) > 1/n_{Sub-B}$$

where, $\theta_{0-1}$: Angle formed by light, which exits from the first electrode 21, with the z-axis at an intersection between the z-axis and the first electrode 21 on a side of the first electrode 21, and $n_{Sub-B}$: Refractive index of the transparent lower substrate (first substrate 11).

In Example 3 or in Example 4 to be described subsequently herein, each organic layer 23 is composed specifically of a red-light emitting organic layer in a red-light emitting organic EL device forming a red-light emitting subpixel, a green-light emitting organic layer in a green-light emitting organic EL device forming a green-light emitting subpixel, and a blue-light emitting organic layer in a blue-light emitting organic EL device forming a blue-light emitting subpixel. A detailed description of these organic layers are omitted herein, because the order of stacking of the red-light emitting organic layer, green-light emitting organic layer and blue-light emitting organic layer can be similar to that in the stacked structure of the red-light emitting organic layer, green-light emitting organic layer and blue-light emitting organic layer described in Example 1 except that they are arranged upside down.

Values of $\lambda$, $L_1$, $OL_1$, $2OL_1/\lambda$, $L_2$, $OL_2$, $2OL_2/\lambda$, $n_{ave}$, $\{-2\Phi_1/(2\Pi)+m_1\}$, $\{-2\Phi_2/(2\Pi)+m_2\}$ in the red-light emitting organic layer, green-light emitting organic layer and blue-light emitting organic layer are as shown in Table 3. It is, however, to be noted that $m_1 = 1$ and $m_2 = 0$.

EXAMPLE 4

Example 4 relates to a display device with which the fourth embodiment of the present invention is concerned, and specifically to an organic EL display device. A schematic fragmentary cross-sectional view of the organic EL display device of Example 4 is shown in FIG. 10. It is to be noted that a schematic fragmentary cross-sectional view of its organic layer and the like is similar to that depicted in FIG. 9. The organic EL display device of Example 4 is also an organic EL color display device of the active matrix type, and is also of the bottom-emitting type. Namely, light is outputted through a first electrode which corresponds to a lower electrode.

Different from Example 3, a first substrate 11 and a transparent lower substrate 35 are bonded together via an adhesive layer 36 in the organic EL display device of Example 4, and light-emitting portions 10D are arranged above a first side 35A of the transparent lower substrate 35. Lens portions 70 are formed on the first side 35A of the transparent lower substrate 35 such that light, which is extracted from the light-emitting layer 23A through the first electrode 21, is allowed to pass through the lens portions 70. Similar to the light-emitting devices illustrated in the schematic layout diagram of FIG. 5, plural light-emitting devise 10B are arrayed in stripes, and plural lens portions 70 are arranged per light-emitting device 10D. Specifically, when the planar shape of the light-emitting region of each light-emitting device 10D is assumed to be rectangular, the length of one side of such a light-emitting region is assumed to be $L_p$, and the length of another side perpendicularly intersecting the one side is assumed to be $\alpha \times L_p$ (coefficient $\alpha > 1$, $\alpha = 3$ in Example 4), the specific number of lens portions 70 arranged per light-emitting device 10D is set at the integer part of the coefficient $\alpha$, namely, "3".

In the organic EL display device of Example 4, each lens portion 70 is composed of an aspherical convex lens. When an axis of the lens portion 70 as an optic axis is assumed to be a z-axis, the organic EL display device of Example 4 satisfies the following equation $$\sin(\theta_{0-1}) > 1/n_{Sub-B}$$

where, $\theta_{0-1}$: Angle formed by light, which exits from the first electrode 21, with the z-axis at an intersection between the z-axis and the first electrode 21 on a side of the first electrode 21, and $n_{Sub-B}$: Refractive index of the transparent lower substrate 35.

The value of $\theta_{0-1}$ and that of $n_{Sub-B}$ are as shown in Table 2.

An outline of a fabrication process of the organic EL display device of Example 1 will hereinafter be described with reference to FIGS. 14A through 14F.

Step 1

Corresponding to the respective subpixels, TFTs are firstly formed on the first substrate 11 by a well-known method. Each TFT is constructed of the gate electrode 12 formed on the first substrate 11, the gate insulating film 13 formed above the first substrate 11 and gate electrode 12, the source/drain region 14 arranged in the semiconductor layer formed on the gate insulating film 13, and the channel-forming region 15 which is the portion of the semiconductor layer, the portion being located between the source/drain regions 14 and above the gate electrode 12. In the illustrated example, each TFT is formed in the bottom gate structure although it may be formed in a top gate structure. The gate electrode 12 of each TFT is connected to a scanning circuit (not shown). After a lower interlayer insulating layer 16A of $SiO_2$ is then formed on the first substrate 11 by CVD to cover the TFTs, openings 16' are formed in the lower interlayer insulating layer 16A by photolithography and etching (see FIG. 14A).

Step 2

By a combination of vacuum evaporation and etching, wirings 17 of aluminum are next formed on the lower interlayer insulating layer 16A. It is to be noted that each wiring 17 is electrically connected to the source/drain region 14 of the corresponding TFT via the associated contact plug 17A arranged in the associated opening 16'. These wirings 17 are connected to a signal supply circuit (not shown). The upper interlayer insulating layer 16B of $SiO_2$ is then formed by CVD over the entire surface. Next, openings 18' are formed in the upper interlayer insulating layer 16B by photolithography and etching (see FIG. 14B).

Step 3

Figure 14A:
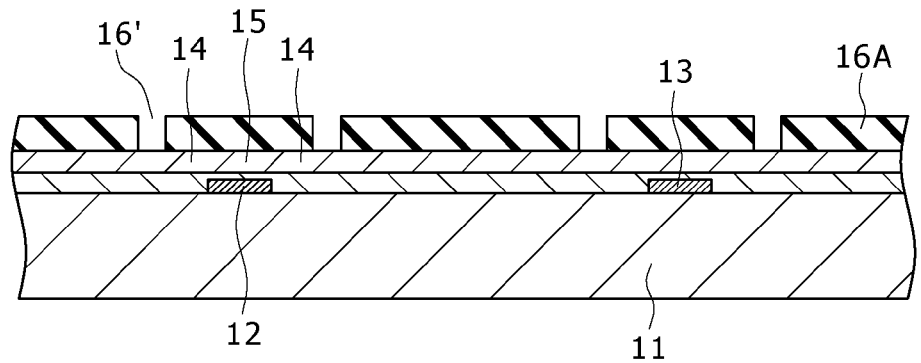
FIGS. 14A through 14F are schematic fragmentary end views of a first substrate, etc. for describing the outline of a fabrication process of the organic electroluminescence display device of Example 1.
Figure 14B:
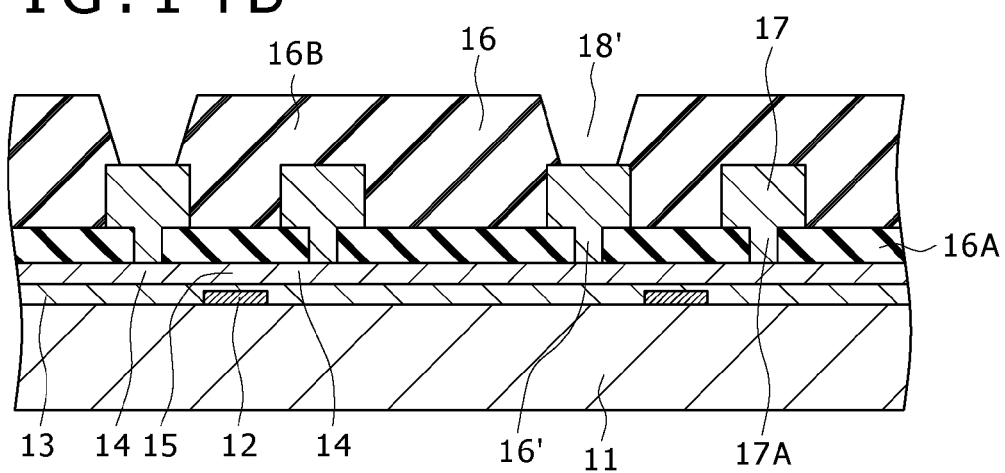
Figure 14C:
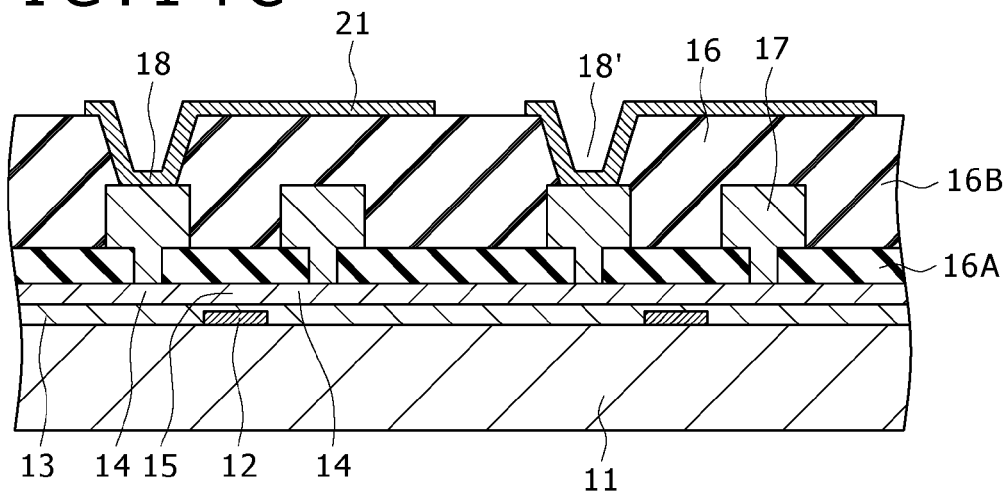

Subsequently, the first electrode 21 of the Al-ND alloy is formed on the upper interlayer insulating layer 16B by a combination of vacuum evaporation and etching (see FIG. 14C). It is to be noted that the first electrode 21 is electrically connected to each wiring 17 via the associated contact plug 18 arranged in the associated opening 18'.

Step 4

Figure 14D:
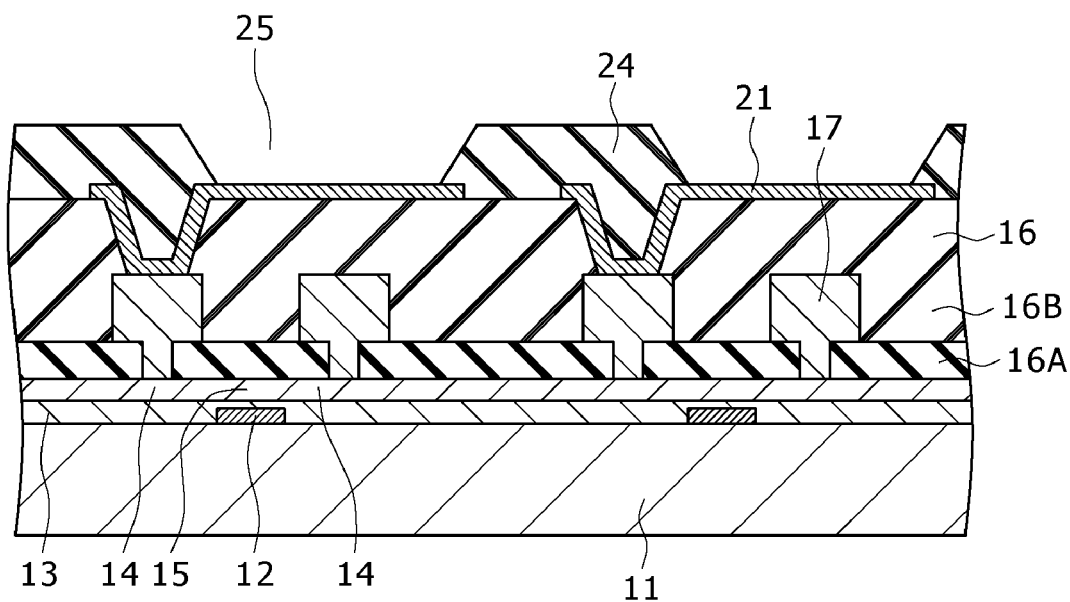

The insulating layer 24 having the openings 25 therein, on the bottom parts of which the first electrode 21 is exposed, is then formed on the interlayer insulating layer 16 including the first electrode 21 (see FIG. 14D). Described specifically, the insulating layer 24 having a thickness of 1 µm and composed of a polyimide resin is formed on the interlayer insulating layer 16 and on peripheral portions of the first electrode 21. A portion of the insulating layer 24, the portion surrounding each opening 25, may preferably form a gentle slope.

Step 5

Figure 14E:
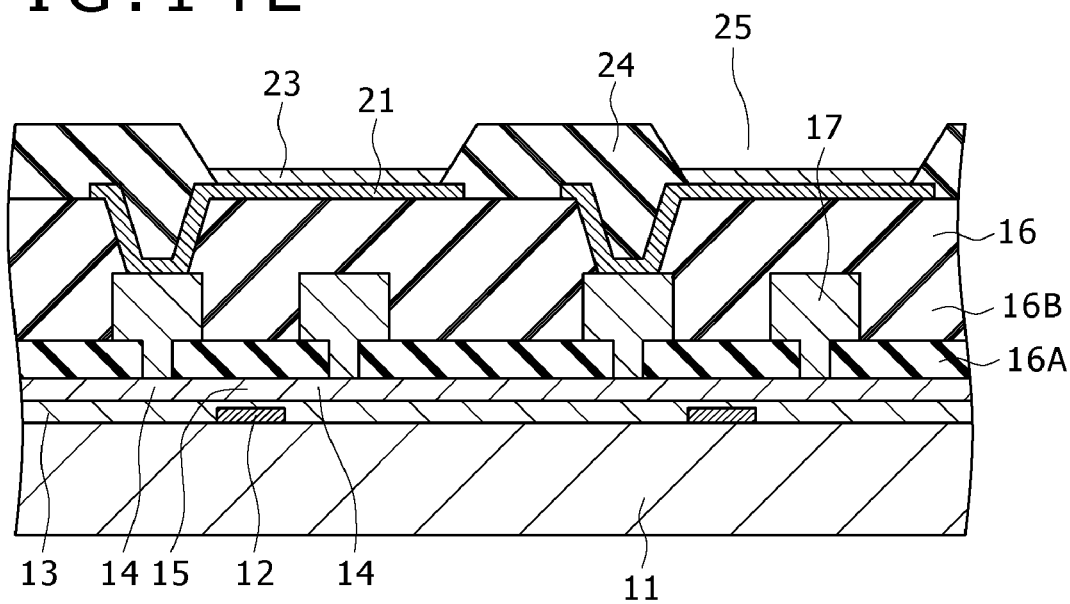

The organic layer 23 is next formed over each portion of the first electrode 21, the portion being exposed in the bottom part of the corresponding opening 25, such that the organic layer 23 extends to the corresponding portion of the insulating layer 24 that surrounds the corresponding opening 25 (see FIG. 14E). It is to be noted that the organic layer 23 is formed, for example, of a hole transport layer, which is composed of an organic material, and a light-emitting layer, which also serves as an electron transport layer, stacked together in this order. Described specifically, using the insulating layer 24 as a sort of spacer, the organic material is vacuum-deposited by resistance heating in such a state that a metal mask (not shown) is placed on raised portions of the insulating layer 24 to form the subpixel-forming organic layer 23. The organic material passes through the openings formed through the metal mask, and deposits extending from a top of the portion of the first electrode 21, the portion being exposed in the bottom part of the opening 25 forming each subpixel, and to a top of the portion of the insulating layer 24, the portion surrounding the opening 25.

Step 6

Figure 14F:
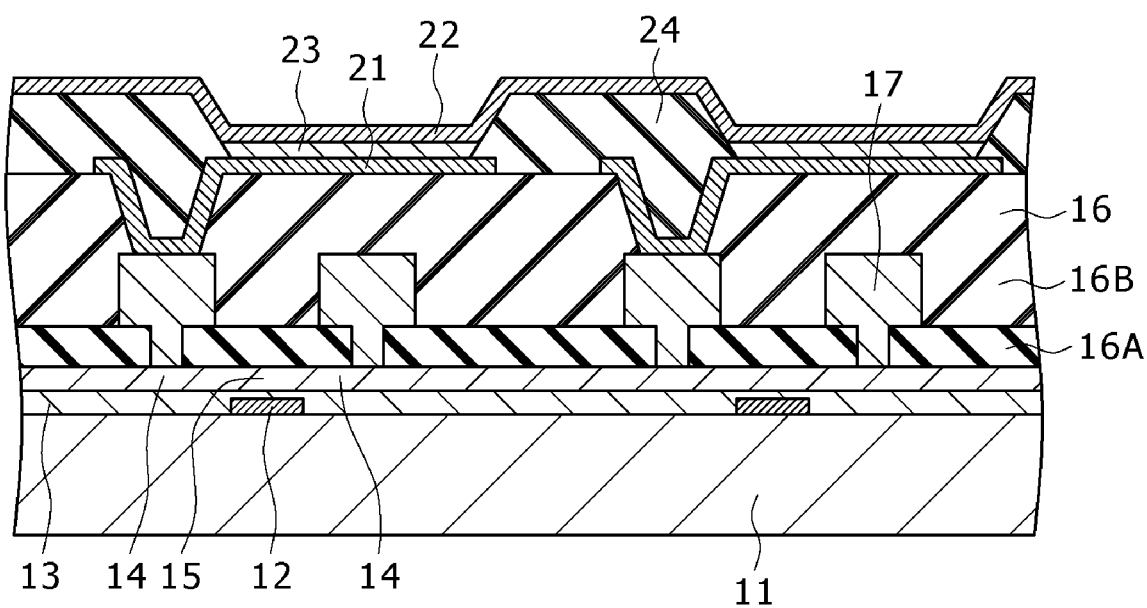
Figure 15A:
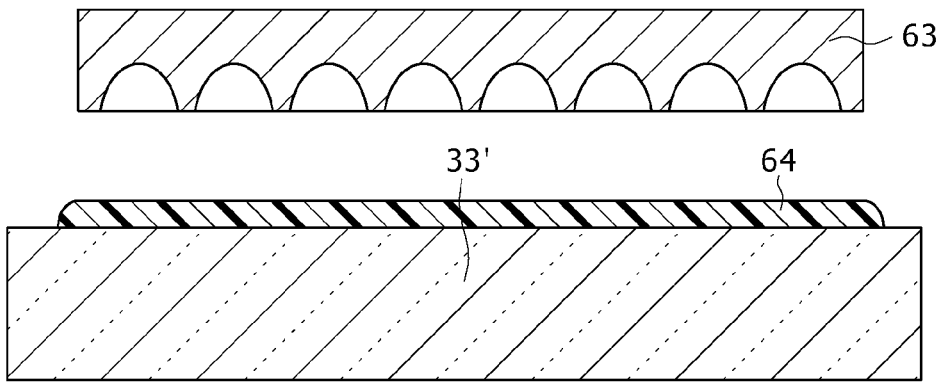
FIGS. 15A through 15D are schematic fragmentary end views of a glass substrate, etc. for describing the outline of a fabrication process of a transparent upper substrate having light reflecting portions.
Figure 15B:
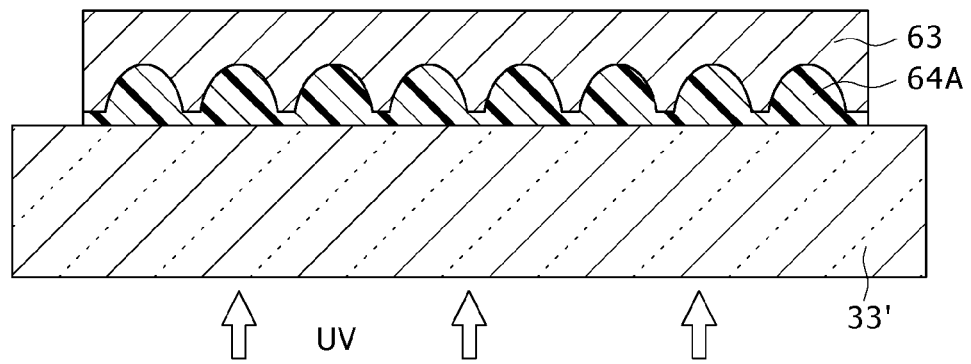
Figure 15C:
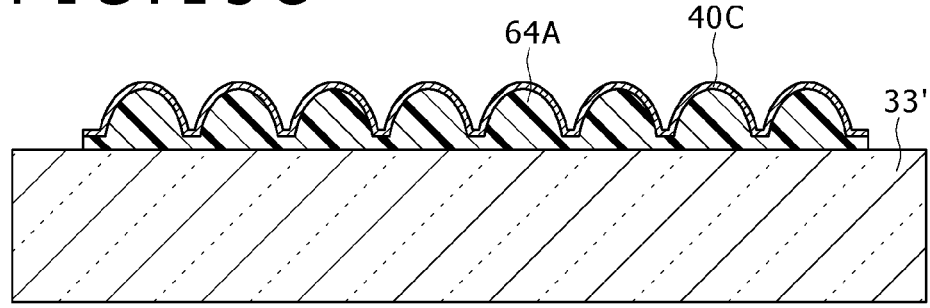
Figure 15D:
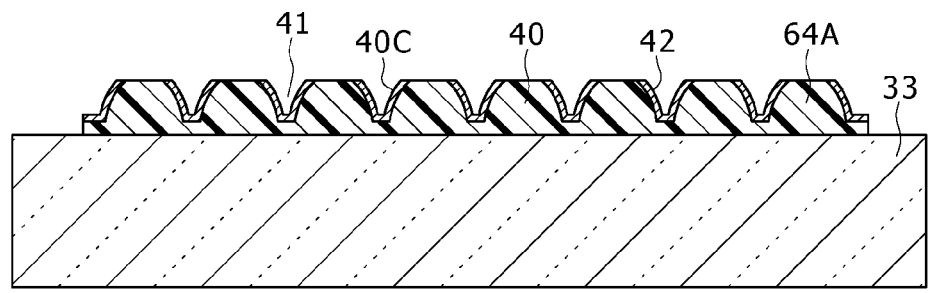

Subsequently, the second electrode 22 is formed over the entire surface of each display region (see FIG. 14F). The second electrode 22 covers the entire surface of the organic layer 23 which forms N×M organic EL devices. However, the second electrode 22 is isolated form the first electrode 21 by the organic layer 23 and insulating layer 24. The second electrode 22 has been formed by vacuum evaporation which is a film-forming process requiring film-forming particles of smaller energy. By continuously conducting the formation of the second electrode 22 in the same vacuum evaporation system as that employed in the formation of the organic layer 23 without exposing the organic layer 23 to the atmosphere, it is possible to avoid deteriorations of the organic layer 23 due to water and oxygen in the atmosphere. Described specifically, the second electrode 22 can be obtained by forming a coevaporated film of Mg—Ag (volume ratio: 10:1) to a thickness of 10 nm.

Step 7

The insulating protective film 31 of silicon nitride ($Si_{1-x}N_x$) is next formed on the second electrode 22 by vacuum evaporation. By continuously conducting the formation of the protective film 31 in the same vacuum evaporation system as that employed in the formation of the second electrode 22 without exposing the second electrode 22 to the atmosphere, it is possible to avoid deteriorations of the organic layer 23 due to water and oxygen in the atmosphere. Subsequently, the protective film 31 and the transparent upper substrate 33 are bonded together by the adhesive layer 32 of the acrylic adhesive. Finally, connections are made to an external circuit to complete the organic EL display device.

The organic EL display devices of Example 2 to Example 4 can also be fabricated in substantially the same manner.

The present invention has been described above based on the preferred Examples, but the present invention shall not be limited to these Examples. The constructions and structures of the organic EL display devices and organic EL devices, the materials forming the organic EL display devices and organic EL devices, and the like in the respective Examples are merely illustrative, and can be modified as desired. In Example 3, a transparent lower substrate may be arranged in addition to the first substrate 11. In Example 4, the first substrate 11 may also serve as a transparent lower substrate.

Another fabrication process of, for example, the transparent upper substrate 33 having the light reflecting portions 40 will hereinafter be described with reference to FIGS. 15A to 15D. Described specifically, a stamper (female die) 63 having complementary configurations to the light reflecting portions 40 is firstly formed using a known technology such as electrocasting, etching, other cutting work, or the like. A UV-curable resin composition 64 is then coated, for example, on a glass substrate 33' having light transmitting property (see FIG. 15A), and this resin composition 64 is shaped using the stamper 63. Described specifically, by irradiating ultraviolet rays onto the resin composition 64 with the stamper 63 being pressed against the resin composition 64, a cured product 64 of the resin composition is obtained (see FIG. 15B). By removing the stamper 63, a patterned intended portion having the shape of the light reflection portions 40 can then be formed on the surface of the cured product 64 of the resin composition. On the surface of the cured product 64 of the resin composition, a metal reflective layer (or a multilayered thin film) 40C made of Al, Ag of the like and having high reflectance is then formed, for example, by vacuum evaporation (see FIG. 15C). The cured product 64A of the resin composition with the metal reflective layer 40C stacked thereon is then cut off at portions (convex portions) thereof, for example, by lapping work (see FIG. 15D). The transparent upper substrate 33 having the light reflecting portions 40 can then be obtained by filling up the cavities 41 with the filling material 62 or the adhesive layer 32.

It should be understood by those skilled in the art that various modifications, combinations, sub-combinations and alterations may occur depending on design requirements and other factor in so far as they are within the scope of the appended claims or the equivalents thereof.

What is claimed is:

1. A display device comprising:
   (A) a plurality of light-emitting devices, each comprising a first electrode, an organic layer having a light-emitting layer, and a second electrode, and configured to resonate light generated in said light-emitting layer between a first interface defined by an interface between said first electrode and said organic layer and a second interface defined by an interface between said second electrode and said organic layer; and
(B) a transparent upper substrate having a first side facing said second electrode and a second side located on an opposite side of said first side, and fixed above said second electrode, wherein:

said display device satisfies equations (1-1), (1-2), (1-3) and (1-4):

$$0.7\{-\Phi_1/(2\Pi)+m_1\} \leq 2\times OL_1/\lambda \leq 1.2\{-\Phi_1/(2\Pi)+m_1\} \quad \text{Equation (1-1)}$$

$$0.7\{-\Phi_2/(2\Pi)+m_2\} \leq 2\times OL_2/\lambda \leq 1.2\{-\Phi_2/(2\Pi)+m_2\} \quad \text{Equation (1-2)}$$

$$L_1 < L_2 \quad \text{Equation (1-3)}$$

$$m_1 < m_2 \quad \text{Equation (1-4)}$$

where,
$L_1$ is a distance from a maximum light-emitting position of said light-emitting layer to said first interface,
$OL_1$ is an optical distance from said maximum light-emitting position of said light-emitting layer to said first interface,
$L_2$ is a distance from said maximum light-emitting position of said light-emitting layer to said second interface,
$OL_2$ is an optical distance from said maximum light-emitting position of said light-emitting layer to said second interface,
$m_1$ and $m_2$ are integers,
$\lambda$ is a wavelength of a maximum peak in a spectrum of light generated in said light-emitting layer,
$\Phi_1$ is a phase shift of reflected light occurred at said first interface (unit: radian), with a proviso of $2\Pi < \Phi_1 \leq 0$, and
$\Phi_2$ is a phase shift of reflected light occurred at said second interface (unit: radian), with a proviso of $2\Pi < \Phi_2 \leq 0$;

light reflecting portions are provided inside said transparent upper substrate;
a portion of said light generated in said light-emitting layer entering said transparent upper substrate is reflected and is extracted from said second side of said transparent upper substrate;
each light reflecting portion is formed of a part of a surface of a solid revolution;
a lower end portion of said light reflecting portion is located at said first side of said transparent upper substrate;
an upper end portion of said light reflecting portion is located within said transparent upper substrate;
said upper end portion of said light reflecting portion is in parallel with said second side of said transparent upper substrate;
when an axis of said light reflecting portion as an axis of revolution of said solid revolution is assumed to be a z-axis, said display device satisfies the following equation:

$$(r_{Ref\text{-}T}+r_{Ref\text{-}B})/L_{Ref} < (n_{Sub\text{-}T}^2-1)^{-1/2} \text{ to } (r_{Ref\text{-}T}+r_{Ref\text{-}B})/L_{Ref} \leq (n_{Sub\text{-}T}^2-1)^{1/2}$$

where,
$r_{Ref\text{-}B}$: radius of said lower end portion of said light reflecting portion,
$r_{Ref\text{-}T}$: radius of said upper end portion of said light reflecting portion,
$L_{Ref}$: distance from said lower end portion to said upper end portion of said light reflecting portion along said z-axis, and
$n_{sub\text{-}T}$: refractive index of said transparent upper substrate;
said light reflecting portion has a cross-sectional shape formed of a part of a parabola when said light reflecting portion is cut along an imaginary plane including said z-axis;
a perpendicular line drawn from a focal point of said parabola to a directrix is aslant to said z-axis; and
said display device satisfies the following equation:

$$0.1 \leq r_{Ref\text{-}B}/L_{Focus} < 0.5$$

where,
$L_{Focus}$ is a distance from an intersection between said imaginary plane and said lower end portion of said reflecting portion to said focal point of said parabola when said light reflecting portion is cut along said imaginary plane.

2. The display device according to claim 1, wherein:
said plurality of light-emitting devices are arrayed in stripes, and
more than one of said light reflecting portions are arranged per each light-emitting device.

3. The display device according to claim 1, wherein an angle of inclination $\theta_{Para}$ of said perpendicular line, which is drawn from said focal point of said parabola to said directrix, to said z-axis satisfies the following equation:

$$\sin(\theta_{Para}) < 1/n_{Sub\text{-}T}$$

where,
$n_{Sub\text{-}T}$ is a refractive index of said transparent upper substrate.

4. The display device according to claim 1, wherein said focal point of said parabola is included in said first side of said transparent upper substrate.

5. The display device according to claim 1, wherein:
said display device satisfies the following equation:

$$\sin(\theta_{0\text{-}2}) > 1/n_{Sub\text{-}T}$$

where,
$\theta_{0\text{-}2}$ is an angle formed by a portion of the light, which is outputted from said second electrode, with said z-axis at an intersection between said z-axis and said second electrode on a side of said second electrode, and
$n_{sub\text{-}T}$: Refractive index of said transparent upper substrate.

6. The display device according to claim 1, wherein:
said first electrode has an average light reflectance of at least 50%, and
said second electrode has an average light reflectance of from 50 to 90%.

7. The display device according to claim 1, wherein said first electrode is formed of a light reflecting material, said second electrode is formed of a semi-transparent material, m1 =0, and m2 =1.

8. The display device according to claim 1, further comprising a protective film and an adhesive layer formed in this order from a side of said second electrode between said second electrode and said transparent upper substrate.

* * * * *

UNITED STATES PATENT AND TRADEMARK OFFICE
CERTIFICATE OF CORRECTION

| | | |
|---|---|---|
| PATENT NO. | : 8,093,801 B2 | Page 1 of 1 |
| APPLICATION NO. | : 12/190858 | |
| DATED | : January 10, 2012 | |
| INVENTOR(S) | : Jiro Yamada et al. | |

It is certified that error appears in the above-identified patent and that said Letters Patent is hereby corrected as shown below:

On the cover page of the patent:

The Notice of a terminal disclaimer is missing. Please correct as follows:

(*) Notice: --This patent is subject to a terminal disclaimer--

Signed and Sealed this
Tenth Day of April, 2012

David J. Kappos
*Director of the United States Patent and Trademark Office*